(12) United States Patent
McCarville et al.

(10) Patent No.: US 11,570,857 B2
(45) Date of Patent: Jan. 31, 2023

(54) THERMAL INCREASE SYSTEM AND METHODS OF OPERATION THEREOF

(71) Applicant: NXP USA, Inc., Austin, TX (US)

(72) Inventors: Jamison Michael McCarville, Tempe, AZ (US); Pierre Marie Jean Piel, Chandler, AZ (US); James Eric Scott, Gilbert, AZ (US); Lionel Mongin, Chandler, AZ (US); Jeremie Simon, Saint Thomas (FR)

(73) Assignee: NXP USA, Inc., Austin, TX (US)

( * ) Notice: Subject to any disclaimer, the term of this patent is extended or adjusted under 35 U.S.C. 154(b) by 572 days.

(21) Appl. No.: 16/360,144

(22) Filed: Mar. 21, 2019

(65) Prior Publication Data

US 2019/0306933 A1 Oct. 3, 2019

(30) Foreign Application Priority Data

Mar. 29, 2018 (EP) .................................... 18305360

(51) Int. Cl.
| | |
|---|---|
| *H05B 6/68* | (2006.01) |
| *H05B 6/62* | (2006.01) |
| *H03H 7/38* | (2006.01) |
| *H05B 6/50* | (2006.01) |

(52) U.S. Cl.
CPC ............... *H05B 6/688* (2013.01); *H03H 7/38* (2013.01); *H05B 6/50* (2013.01); *H05B 6/62* (2013.01)

(58) Field of Classification Search
CPC ... H03H 7/38; H05B 6/50; H05B 6/62; H05B 6/688

USPC ....... 219/703, 702, 705, 709, 716, 746, 756, 219/761, 704, 751, 697; 118/723 MW
See application file for complete search history.

(56) References Cited

U.S. PATENT DOCUMENTS

| | | | |
|---|---|---|---|
| 2,868,940 A | 1/1959 | Jennings et al. | |
| 2,921,189 A | 1/1960 | Nash | |
| 4,303,820 A | 12/1981 | Stottmann et al. | |

(Continued)

FOREIGN PATENT DOCUMENTS

| | | |
|---|---|---|
| CN | 1823683 A | 8/2006 |
| CN | 101161560 A | 4/2008 |

(Continued)

OTHER PUBLICATIONS

Non Final Office Action U.S. Appl. No. 15/456,398; 21 pages (dated Jan. 21, 2020).

(Continued)

*Primary Examiner* — Quang T Van

(57) ABSTRACT

A defrosting system includes an RF signal source, two electrodes proximate to a cavity within which a load to be defrosted is positioned, a transmission path between the RF signal source and the electrodes, and an impedance matching network electrically coupled along the transmission path between the output of the RF signal source and the electrodes. The system also includes power detection circuitry coupled to the transmission path and configured to detect reflected signal power along the transmission path. A system controller is configured to modify, based on the reflected signal power, values of variable capacitors of the impedance matching network to reduce the reflected signal power. The impedance matching network may be a single-ended network or a double-ended network.

7 Claims, 13 Drawing Sheets

(56) References Cited

U.S. PATENT DOCUMENTS

| | | | |
|---|---|---|---|
| 4,333,521 A | 6/1982 | Stottman et al. |
| 4,341,937 A | 7/1982 | Staats |
| 4,507,530 A | 3/1985 | Smith |
| 4,771,355 A | 9/1988 | Emery et al. |
| 4,803,854 A | 2/1989 | Kikuchi et al. |
| 4,870,235 A | 9/1989 | Steers et al. |
| 4,874,914 A | 10/1989 | Eke |
| 4,874,915 A | 10/1989 | Harms et al. |
| 4,980,530 A | 12/1990 | Butot |
| 4,984,015 A | 1/1991 | Okino |
| 5,036,172 A | 7/1991 | Kokkeler et al. |
| 5,180,895 A | 1/1993 | Briggs et al. |
| 5,349,166 A | 9/1994 | Taylor |
| 5,407,524 A | 4/1995 | Patrick et al. |
| 5,436,433 A | 7/1995 | Kim et al. |
| 5,507,055 A | 4/1996 | Blauert et al. |
| 5,512,736 A | 4/1996 | Kang et al. |
| 5,585,766 A | 12/1996 | Shel |
| 5,641,423 A | 6/1997 | Bridges et al. |
| 5,872,475 A | 2/1999 | Otaka |
| 6,198,084 B1 | 3/2001 | Kim |
| 6,247,395 B1 | 6/2001 | Yamamoto |
| 6,252,354 B1 | 6/2001 | Collins et al. |
| 6,259,344 B1 | 7/2001 | Heritier-Best et al. |
| 6,657,173 B2 | 12/2003 | Flugstad |
| 6,784,405 B2 | 8/2004 | Flugstad et al. |
| 6,887,339 B1 | 5/2005 | Goodman et al. |
| 7,761,247 B2 | 7/2010 | Van Zyl |
| 8,162,932 B2 | 4/2012 | Podhajsky et al. |
| 8,207,479 B2 | 6/2012 | Ben-Shmuel et al. |
| 8,375,319 B2 | 2/2013 | Decker et al. |
| 8,562,793 B2 | 10/2013 | Novak |
| 8,742,305 B2 | 6/2014 | Simunovic et al. |
| 9,131,543 B2 | 9/2015 | Ben-Shumel et al. |
| 9,215,756 B2 | 12/2015 | Bilchinsky et al. |
| 9,252,716 B2 | 2/2016 | Yoneda et al. |
| 9,298,873 B2 | 3/2016 | Ishizuka et al. |
| 9,306,533 B1 | 4/2016 | Mavretic |
| 9,337,000 B2 | 5/2016 | Marakhtanov et al. |
| 9,584,090 B2 | 2/2017 | Mavretic |
| 9,720,022 B2 | 8/2017 | Howald et al. |
| 9,755,576 B2 | 9/2017 | Perreault et al. |
| 9,809,480 B2 | 11/2017 | Stephenson et al. |
| 9,967,925 B2 | 5/2018 | Brill |
| 9,973,167 B2 | 5/2018 | Shi et al. |
| 10,124,187 B2 | 11/2018 | Schwarz et al. |
| 10,433,376 B2 | 10/2019 | Chaimov et al. |
| 2002/0003141 A1 | 1/2002 | Blaker et al. |
| 2002/0046474 A1 | 4/2002 | Novak et al. |
| 2003/0205571 A1 | 11/2003 | Flugstad et al. |
| 2004/0016744 A1 | 1/2004 | Ottaway |
| 2004/0084380 A1 | 5/2004 | Kicinski |
| 2006/0081624 A1 | 4/2006 | Takada et al. |
| 2007/0155347 A1 | 7/2007 | Heuermann et al. |
| 2007/0272358 A1* | 11/2007 | Iseda ............... H01J 37/32165 156/345.28 |
| 2008/0264800 A1 | 10/2008 | Schlager et al. |
| 2008/0314999 A1 | 12/2008 | Strand |
| 2009/0057302 A1 | 3/2009 | Ben-Shmuel |
| 2009/0058550 A1 | 3/2009 | Ella et al. |
| 2009/0194526 A1 | 8/2009 | Buchanan |
| 2010/0141042 A1 | 6/2010 | Kesler et al. |
| 2010/0239757 A1 | 9/2010 | Murata |
| 2010/0247403 A1 | 9/2010 | Hancock |
| 2011/0176911 A1 | 7/2011 | Couturier et al. |
| 2011/0278284 A1 | 11/2011 | Tian et al. |
| 2012/0000888 A1 | 1/2012 | Kawasaki et al. |
| 2012/0067872 A1 | 3/2012 | Libman et al. |
| 2012/0075033 A1 | 3/2012 | Ouyang et al. |
| 2012/0086519 A1 | 4/2012 | Hauer et al. |
| 2012/0103973 A1 | 5/2012 | Rogers et al. |
| 2012/0119842 A1* | 5/2012 | Gu ............... H03H 7/40 333/17.3 |
| 2012/0122072 A1 | 5/2012 | Bilchinsky et al. |
| 2012/0164022 A1 | 6/2012 | Muginstein et al. |
| 2012/0168645 A1 | 7/2012 | Atzmony et al. |
| 2013/0080098 A1 | 3/2013 | Hadad et al. |
| 2013/0193913 A1 | 8/2013 | Takada et al. |
| 2013/0257667 A1 | 10/2013 | Kang |
| 2013/0284725 A1 | 10/2013 | Bilchinsky et al. |
| 2013/0119055 A1 | 11/2013 | Wohl et al. |
| 2013/0293989 A1 | 11/2013 | Shipley et al. |
| 2013/0334214 A1 | 12/2013 | Yogev et al. |
| 2014/0167878 A1 | 6/2014 | Lee |
| 2014/0287100 A1 | 9/2014 | Libman |
| 2014/0312972 A1 | 10/2014 | Yoneda et al. |
| 2015/0091440 A1 | 4/2015 | Marakhtanov et al. |
| 2015/0091441 A1 | 4/2015 | Marakhtanov et al. |
| 2015/0351164 A1 | 12/2015 | Wesson et al. |
| 2016/0095196 A1 | 3/2016 | Chen et al. |
| 2016/0181986 A1 | 6/2016 | Perreault et al. |
| 2016/0198530 A1 | 7/2016 | Piel et al. |
| 2016/0221441 A1 | 8/2016 | Hall et al. |
| 2016/0248396 A1 | 8/2016 | Mavretic |
| 2016/0308560 A1 | 10/2016 | Howald et al. |
| 2016/0343548 A1 | 11/2016 | Howald et al. |
| 2017/0096352 A1 | 4/2017 | Hughes et al. |
| 2017/0181455 A1 | 6/2017 | Bullo et al. |
| 2017/0266986 A1 | 9/2017 | Yamada |
| 2017/0302236 A1 | 10/2017 | Oshita |
| 2018/0042073 A1 | 2/2018 | Scott et al. |
| 2018/0042074 A1 | 2/2018 | Qiu et al. |
| 2018/0062605 A1 | 3/2018 | Brounley et al. |
| 2018/0115298 A1 | 4/2018 | Fujimoto et al. |
| 2018/0146518 A1 | 5/2018 | Ma et al. |
| 2018/0220499 A1 | 8/2018 | Sms et al. |
| 2018/0269037 A1 | 9/2018 | Kamarehi et al. |
| 2018/0374685 A1 | 12/2018 | Collins et al. |
| 2019/0008005 A1 | 1/2019 | Dore et al. |
| 2019/0141799 A1 | 5/2019 | Mongin et al. |
| 2019/0158039 A1 | 5/2019 | Koya et al. |
| 2019/0158055 A1 | 5/2019 | Mongin et al. |
| 2019/0191500 A1 | 6/2019 | Mongin et al. |
| 2019/0191501 A1 | 6/2019 | Piel et al. |
| 2019/0320506 A1 | 10/2019 | Guatta et al. |
| 2020/0084844 A1 | 3/2020 | Qiu et al. |
| 2020/0092957 A1 | 3/2020 | Ma et al. |
| 2020/0120765 A1 | 4/2020 | Xu et al. |
| 2020/0136497 A1 | 4/2020 | Beck |
| 2020/0170081 A1 | 5/2020 | McCarville et al. |

FOREIGN PATENT DOCUMENTS

| | | |
|---|---|---|
| CN | 201914941 U | 8/2011 |
| CN | 102951760 A | 3/2013 |
| CN | 203021337 U | 6/2013 |
| CN | 203247118 U | 10/2013 |
| CN | 103903944 A | 7/2014 |
| CN | 104782226 A | 7/2015 |
| CN | 104930804 A | 9/2015 |
| CN | 105142253 A | 12/2015 |
| CN | 105206494 A | 12/2015 |
| CN | 105357788 A | 2/2016 |
| CN | 105768922 A | 7/2016 |
| CN | 106225029 A | 12/2016 |
| CN | 106234557 A | 12/2016 |
| CN | 106301362 A | 1/2017 |
| CN | 205860137 U | 1/2017 |
| CN | 205919380 U | 2/2017 |
| CN | 206213147 U | 6/2017 |
| CN | 206227504 U | 6/2017 |
| CN | 107359705 A | 11/2017 |
| CN | 107373296 A | 11/2017 |
| CN | 206724547 U | 12/2017 |
| CN | 108521691 A | 9/2018 |
| CN | 108521691 A | 9/2018 |
| CN | 108812854 A | 11/2018 |
| CN | 109000396 A | 12/2018 |
| CN | 208521691 A | 2/2019 |
| CN | 104377106 A | 2/2020 |
| DE | 38 18 491 A1 | 12/1989 |
| DE | 3818491 A1 | 12/1989 |
| DE | 11 2014 001599 T5 | 6/2016 |
| EP | 0 597 497 A1 | 5/1994 |

(56) References Cited

FOREIGN PATENT DOCUMENTS

| | | |
|---|---|---|
| EP | 1 577 281 A1 | 9/2005 |
| EP | 01818076 A1 | 8/2007 |
| EP | 2 445 312 A1 | 4/2012 |
| EP | 3 240 142 A1 | 11/2017 |
| EP | 3240142 A1 | 11/2017 |
| EP | 3280225 A1 | 2/2018 |
| GB | 621320 | 4/1949 |
| GB | 2 465 442 A | 5/2010 |
| JP | S5111237 A | 1/1976 |
| JP | 55-44199 | 3/1980 |
| JP | S56-148273 A | 11/1981 |
| JP | S570129678 A | 8/1982 |
| JP | S5950305 | 12/1984 |
| JP | 63-207921 | 8/1988 |
| JP | 3-72840 A | 3/1991 |
| JP | H0327120 U | 3/1991 |
| JP | H0513162 A | 1/1993 |
| JP | H06215955 A | 8/1994 |
| JP | H07-249486 A | 9/1995 |
| JP | H027269868 A | 10/1995 |
| JP | 08-225682 | 1/1996 |
| JP | 08-185966 A | 7/1996 |
| JP | H-08255682 | 10/1996 |
| JP | 10134953 A | 5/1998 |
| JP | 2003 332037 A | 11/2003 |
| JP | 2003347034 A | 12/2003 |
| JP | 2003347035 A | 12/2003 |
| JP | 2003347053 A | 12/2003 |
| JP | 2004-247128 | 2/2004 |
| JP | 2004057101 A | 2/2004 |
| JP | 20040633008 A | 2/2004 |
| JP | 2004247128 | 9/2004 |
| JP | 2004362916 A | 12/2004 |
| JP | 2005050678 A | 3/2005 |
| JP | 2012207900 A | 10/2012 |
| JP | 2017017003 A | 1/2017 |
| JP | 2017 182885 A | 10/2017 |
| JP | 6375032 | 6/2018 |
| KR | 100133085 | 4/1998 |
| WO | 2007/117754 A2 | 10/2007 |
| WO | 2010/060233 A1 | 6/2010 |
| WO | 2012/001523 A1 | 1/2012 |
| WO | WO-2012/024517 A1 | 2/2012 |
| WO | 2013/033330 A1 | 3/2013 |
| WO | 2014/006510 A2 | 1/2014 |
| WO | 2015/028839 A1 | 3/2015 |
| WO | 2015/052145 A1 | 4/2015 |
| WO | 2017/017407 A1 | 2/2017 |
| WO | 2017/123145 A1 | 7/2017 |
| WO | WO-2017144873 A1 | 8/2017 |
| WO | 2018/223939 A1 | 12/2018 |
| WO | 2018/223946 A1 | 12/2018 |

OTHER PUBLICATIONS

Notice of Allowance; U.S. Appl. No. 16/230,425; 10 pages (dated Apr. 21, 2021).
Final Office Action; U.S. Appl. No. 15/456,398; 28 pages (dated Jul. 22, 2020).
Non Final Office Action; U.S. Appl. No. 15/806,075; 9 pages (dated Dec. 11, 2019).
Notice of Allowance; U.S. Appl. No. 15/816,802; 5 pages (dated Jun. 4, 2020).
Final Office Action; U.S. Appl. No. 15/843,290; 11 pages (dated Apr. 23, 2020).
Final Office Action; U.S. Appl. No. 15/806,075; 11 pages (dated Jun. 19, 2020).
U.S. Appl. No. 16/225,749, filed Dec. 19, 2018; not yet published; 102 pages.
U.S. Appl. No. 16/230,425; not yet published; 122 Pages (filed Dec. 21, 2018).
Notice of Allowance; U.S. Appl. No. 15/454,345; 9 pages (dated Jan. 15, 2020).
Final Office Action; U.S. Appl. No. 16/131,636; 22 pages dated Jul. 7, 2021.
Notice of Allowance; U.S. Appl. No. 15/843,290; 7 pages (dated Jul. 31, 2020).
Non Final Office Action; U.S. Appl. No. 16/126,963; 15 pages (dated Jul. 28, 2020).
Non Final Office Action; U.S. Appl. No. 16/917,035; 13 pages (dated Aug. 3, 2020).
Non Final Rejection; U.S. Appl. No. 16/131,636; 20 pages (dated Feb. 23, 2021).
Notice of Allowance; U.S. Appl. No. 16/126,963; 8 pages (dated Dec. 31, 2020).
Notice of Allowance; U.S. Appl. No. 15/456,398; pages (dated Apr. 6, 2021).
Non Final Office Action; U.S. Appl. No. 16/225,749; 10 pages (dated Apr. 7, 2021).
Notice of Allowance; U.S. Appl. No. 15/806,075; 10 pages (dated Oct. 5, 2020).
Non Final Office Action; U.S. Appl. No. 15/816,802; 22 pages dated Feb. 20, 2020.
Non Final Office Action; U.S. Appl. No. 15/454,345; 17 pages (dated Jun. 12, 2019).
Cottee, Christopher et al; "Design of Matching Circuit Controllers for Radio-Frequency Healing"; IEEE Transactions on Control Systems Technology, vol. 11, No. 1; 10 pages (Jan. 2003).
Ameri, M. et al.; "Pattern Matching Algorithm for Identification of Load Mass of an Elastic Robot Arm"; American Control Conference; 2 pages (1988).
Doherty, Mark F. et al; "Automatic Detection of Mass-Resolved Ion Conics"; IEEE Transactions on Geoscience and Remote Sensing, vol. 31, No. 2; 10 pages (Mar. 1993).
Notice of Allowance; U.S. Appl. No. 16/225,749; 5 pages (dated Sep. 22, 2021).
Non Final Office Action; U.S. Appl. No. 15/923,455; 20 pages (dated Oct. 29, 2020).
Non Final Office Action; U.S. Appl. No. 16/225,749; 8 pages (dated Apr. 7, 2021).
Final Office Action; U.S. Appl. No. 16/225,749; 8 pages (dated Aug. 20, 2021).
Non Final Office Action; U.S. Appl. No. 16/131,636; 26 pages (dated Dec. 30, 2021).
Final Rejection; U.S. Appl. No. 15/923,455; 22 pages (dated Feb. 25, 2021).
Wang, Chong-hao et al; "Research Progress of Cleaning and Thawing Equipment on Meat Food"; School of Energy and Power Engineering, University of Shanghai for Science and Technology, Shanghai, CN; English abstract; 5 pages (Apr. 2017).
Notice of Allowance; U.S. Appl. No. 15/923,455; 10 pages (dated Mar. 18, 2022).
Non Final Office Action; U.S. Appl. No. 16/131,636; 26 pages (dated Mar. 29, 2022).

* cited by examiner

THERMAL INCREASE SYSTEM AND METHODS OF OPERATION THEREOF

RELATED APPLICATION

This application claims priority under 35 U.S.C. 119(b) to European Patent application number 18305360.2 filed on Mar. 28, 2018.

TECHNICAL FIELD

Embodiments of the subject matter described herein relate generally to apparatus and methods of defrosting a load using radio frequency (RF) energy.

BACKGROUND

Conventional capacitive food defrosting (or thawing) systems include large planar electrodes contained within a heating compartment. After a food load is placed between the electrodes and the electrodes are brought into contact with the food load, low power electromagnetic energy is supplied to the electrodes to provide gentle warming of the food load. As the food load thaws during the defrosting operation, the impedance of the food load changes. Accordingly, the power transfer to the food load also changes during the defrosting operation. The duration of the defrosting operation may be determined, for example, based on the weight of the food load, and a timer may be used to control cessation of the operation.

Although good defrosting results are possible using such systems, the dynamic changes to the food load impedance may result in inefficient defrosting of the food load. In addition, inaccuracies inherent in determining the duration of the defrosting operation based on weight may result in premature cessation of the defrosting operation, or late cessation after the food load has begun to cook. What are needed are apparatus and methods for defrosting food loads (or other types of loads) that may result in efficient and even defrosting throughout the load and cessation of the defrosting operation when the load is at a desired temperature.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
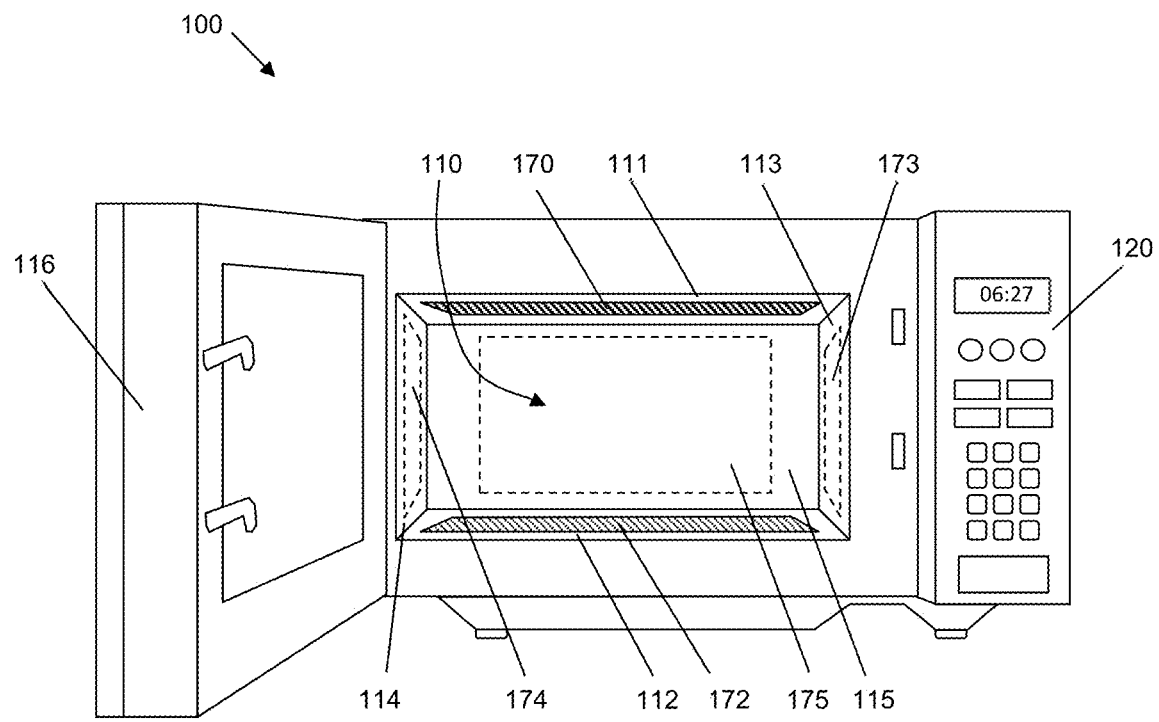
FIG. 1 is a perspective view of a defrosting appliance, in accordance with an example embodiment.

The following detailed description is merely illustrative in nature and is not intended to limit the embodiments of the subject matter or the application and uses of such embodiments. As used herein, the words "exemplary" and "example" mean "serving as an example, instance, or illustration." Any implementation described herein as exemplary or an example is not necessarily to be construed as preferred or advantageous over other implementations. Furthermore, there is no intention to be bound by any expressed or implied theory presented in the preceding technical field, background, or the following detailed description.

Embodiments of the subject matter described herein relate to solid-state defrosting apparatus that may be incorporated into stand-alone appliances or into other systems. As described in greater detail below, embodiments of solid-state defrosting apparatus include both "unbalanced" defrosting apparatus and "balanced" apparatus. For example, exemplary "unbalanced" defrosting systems are realized using a first electrode disposed in a cavity, a single-ended amplifier arrangement (including one or more transistors), a single-ended impedance matching network coupled between an output of the amplifier arrangement and the first electrode, and a measurement and control system that can detect when a defrosting operation has completed. In contrast, exemplary "balanced" defrosting systems are realized using first and second electrodes disposed in a cavity, a single-ended or double-ended amplifier arrangement (including one or more transistors), a double-ended impedance matching network coupled between an output of the amplifier arrangement and the first and second electrodes, and a measurement and control system that can detect when a defrosting operation has completed. In various embodiments, the impedance matching network includes a variable impedance matching network that can be adjusted during the defrosting operation to improve matching between the amplifier arrangement and the cavity.

Generally, the term "defrosting" means to elevate the temperature of a frozen load (e.g., a food load or other type of load) to a temperature at which the load is no longer frozen (e.g., a temperature at or near 0 degrees Celsius). As used herein, the term "defrosting" more broadly means a process by which the thermal energy or temperature of a load (e.g., a food load or other type of load) is increased through provision of RF power to the load. Accordingly, in various embodiments, a "defrosting operation" may be performed on a load with any initial temperature (e.g., any initial temperature above or below 0 degrees Celsius), and the defrosting operation may be ceased at any final temperature that is higher than the initial temperature (e.g., including final temperatures that are above or below 0 degrees Celsius). That said, the "defrosting operations" and "defrosting systems" described herein alternatively may be referred to as "thermal increase operations" and "thermal increase systems." The term "defrosting" should not be construed to limit application of the invention to methods or systems that are only capable of raising the temperature of a frozen load to a temperature at or near 0 degrees Celsius.

FIG. 1 is a perspective view of a defrosting system 100, in accordance with an example embodiment. Defrosting system 100 includes a defrosting cavity 110 (e.g., cavity 360, 760, 1174, FIGS. 3, 7, 11), a control panel 120, one or more radio frequency (RF) signal sources (e.g., RF signal source 320, 720, 1120, FIGS. 3, 7, 11), a power supply (e.g., power supply 326, 726, FIGS. 3, 7), a first electrode 170 (e.g., electrode 340, 740, 1170, FIGS. 3, 7, 11), a second electrode 172 (e.g., electrode 750, 1172, FIGS. 7, 11), impedance matching circuitry (e.g., circuits 334, 370, 734, 772, 1160, FIGS. 3, 7, 11), power detection circuitry (e.g., power detection circuitry 330, 730, 1180, FIGS. 3, 7, 11), and a system controller (e.g., system controller 312, 712, 1130, FIGS. 3, 7, 11). The defrosting cavity 110 is defined by interior surfaces of top, bottom, side, and back cavity walls 111, 112, 113, 114, 115 and an interior surface of door 116. With door 116 closed, the defrosting cavity 110 defines an enclosed air cavity. As used herein, the term "air cavity" may mean an enclosed area that contains air or other gasses (e.g., defrosting cavity 110).

According to an "unbalanced" embodiment, the first electrode 170 is arranged proximate to a cavity wall (e.g., top wall 111), the first electrode 170 is electrically isolated from the remaining cavity walls (e.g., walls 112-115 and door 116), and the remaining cavity walls are grounded. In such a configuration, the system may be simplistically modeled as a capacitor, where the first electrode 170 functions as one conductive plate (or electrode), the grounded cavity walls (e.g., walls 112-115) function as a second conductive plate (or electrode), and the air cavity (including any load contained therein) function as a dielectric medium between the first and second conductive plates. Although not shown in FIG. 1, a non-electrically conductive barrier (e.g., barrier 362, 762, FIGS. 3, 7) also may be included in the system 100, and the non-conductive barrier may function to electrically and physically isolate the load from the bottom cavity wall 112. Although FIG. 1 shows the first electrode 170 being proximate to the top wall 111, the first electrode 170 alternatively may be proximate to any of the other walls 112-115, as indicated by electrodes 172-175.

According to a "balanced" embodiment, the first electrode 170 is arranged proximate to a first cavity wall (e.g., top wall 111), a second electrode 172 is arranged proximate to an opposite, second cavity wall (e.g., bottom wall 112), and the first and second electrodes 170, 172 are electrically isolated from the remaining cavity walls (e.g., walls 113-115 and door 116). In such a configuration, the system also may be simplistically modeled as a capacitor, where the first electrode 170 functions as one conductive plate (or electrode), the second electrode 172 functions as a second conductive plate (or electrode), and the air cavity (including any load contained therein) function as a dielectric medium between the first and second conductive plates. Although not shown in FIG. 1, a non-electrically conductive barrier (e.g., barrier 714, 1156, FIGS. 7, 11) also may be included in the system 100, and the non-conductive barrier may function to electrically and physically isolate the load from the second electrode 172 and the bottom cavity wall 112. Although FIG. 1 shows the first electrode 170 being proximate to the top wall 111, and the second electrode 172 being proximate to the bottom wall 112, the first and second electrodes 170, 172 alternatively may be proximate to other opposite walls (e.g., the first electrode may be electrode 173 proximate to wall 113, and the second electrode may be electrode 174 proximate to wall 114.

According to an embodiment, during operation of the defrosting system 100, a user (not illustrated) may place one or more loads (e.g., food and/or liquids) into the defrosting cavity 110, and optionally may provide inputs via the control panel 120 that specify characteristics of the load(s). For example, the specified characteristics may include an approximate weight of the load. In addition, the specified load characteristics may indicate the material(s) from which the load is formed (e.g., meat, bread, liquid). In alternate embodiments, the load characteristics may be obtained in some other way, such as by scanning a barcode on the load packaging or receiving a radio frequency identification (RFID) signal from an RFID tag on or embedded within the load. Either way, as will be described in more detail later, information regarding such load characteristics enables the system controller (e.g., system controller 312, 712, 1130, FIGS. 3, 7, 11) to establish an initial state for the impedance matching network of the system at the beginning of the defrosting operation, where the initial state may be relatively close to an optimal state that enables maximum RF power transfer into the load. Alternatively, load characteristics may not be entered or received prior to commencement of a defrosting operation, and the system controller may establish a default initial state for the impedance matching network.

To begin the defrosting operation, the user may provide an input via the control panel 120. In response, the system controller causes the RF signal source(s) (e.g., RF signal source 320, 720, 1120, FIGS. 3, 7, 11) to supply an RF signal to the first electrode 170 in an unbalanced embodiment, or to both the first and second electrodes 170, 172 in a balanced embodiment, and the electrode(s) responsively radiate electromagnetic energy into the defrosting cavity 110. The electromagnetic energy increases the thermal energy of the load (i.e., the electromagnetic energy causes the load to warm up).

During the defrosting operation, the impedance of the load (and thus the total input impedance of the cavity 110 plus load) changes as the thermal energy of the load increases. The impedance changes alter the absorption of RF energy into the load, and thus alter the magnitude of reflected power. According to an embodiment, power detection circuitry (e.g., power detection circuitry 330, 730, 1180, FIGS. 3, 7, 11) continuously or periodically measures the reflected power along a transmission path (e.g., transmission path 328, 728, 1148, FIGS. 3, 7, 11) between the RF signal source (e.g., RF signal source 320, 720, 1120, FIGS. 3, 7, 11) and the electrode(s) 170, 172. Based on these measurements, the system controller (e.g., system controller 312, 712, 1130, FIGS. 3, 7, 11) may detect completion of the defrosting operation, as will be described in detail below. According to a further embodiment, the impedance matching network is variable, and based on the reflected power measurements (or both the forward and reflected power measurements), the system controller may alter the state of the impedance matching network during the defrosting operation to increase the absorption of RF power by the load.

Figure 2:
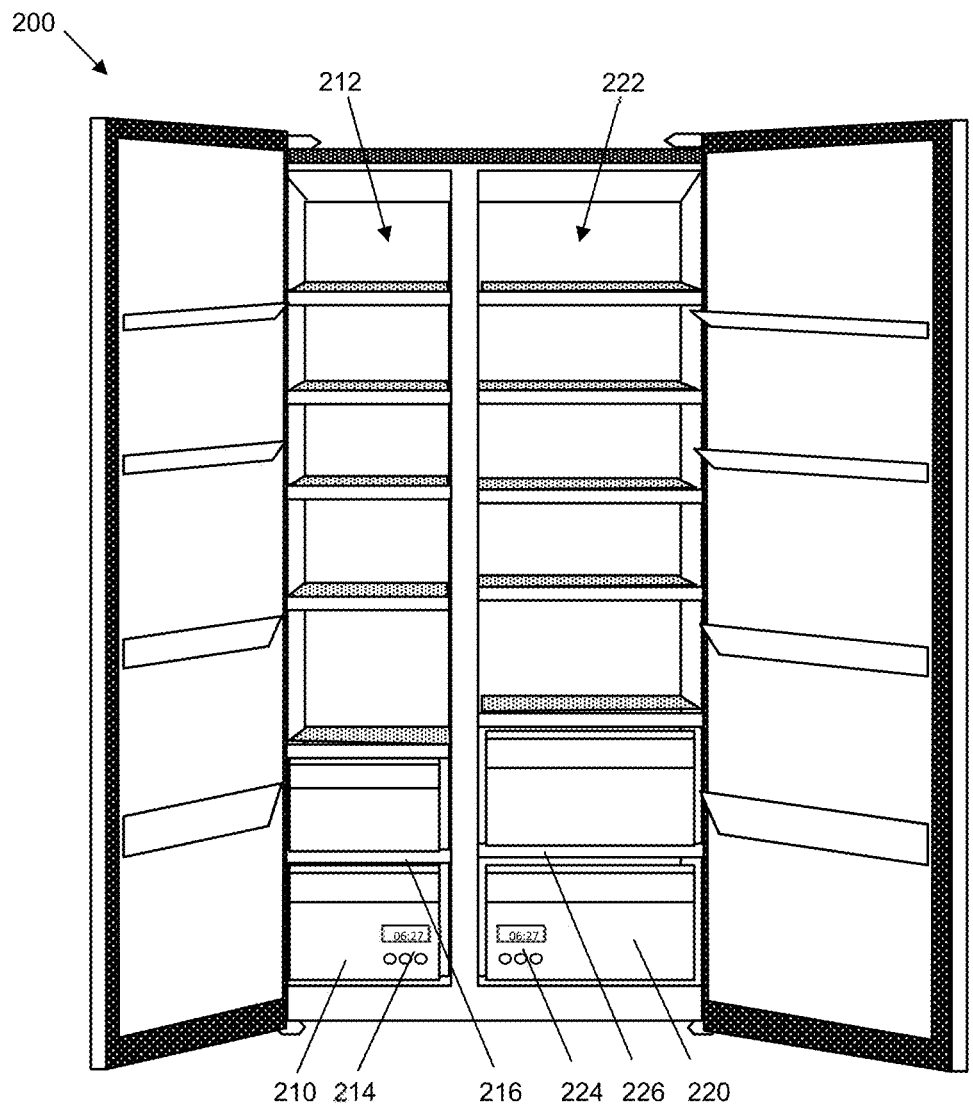
FIG. 2 is a perspective view of a refrigerator/freezer appliance that includes other example embodiments of defrosting systems.

The defrosting system 100 of FIG. 1 is embodied as a counter-top type of appliance. In a further embodiment, the defrosting system 100 also may include components and functionality for performing microwave cooking operations. Alternatively, components of a defrosting system may be incorporated into other types of systems or appliances. For example, FIG. 2 is a perspective view of a refrigerator/freezer appliance 200 that includes other example embodiments of defrosting systems 210, 220. More specifically, defrosting system 210 is shown to be incorporated within a freezer compartment 212 of the system 200, and defrosting system 220 is shown to be incorporated within a refrigerator compartment 222 of the system. An actual refrigerator/freezer appliance likely would include only one of the defrosting systems 210, 220, but both are shown in FIG. 2 to concisely convey both embodiments.

Figure 3:
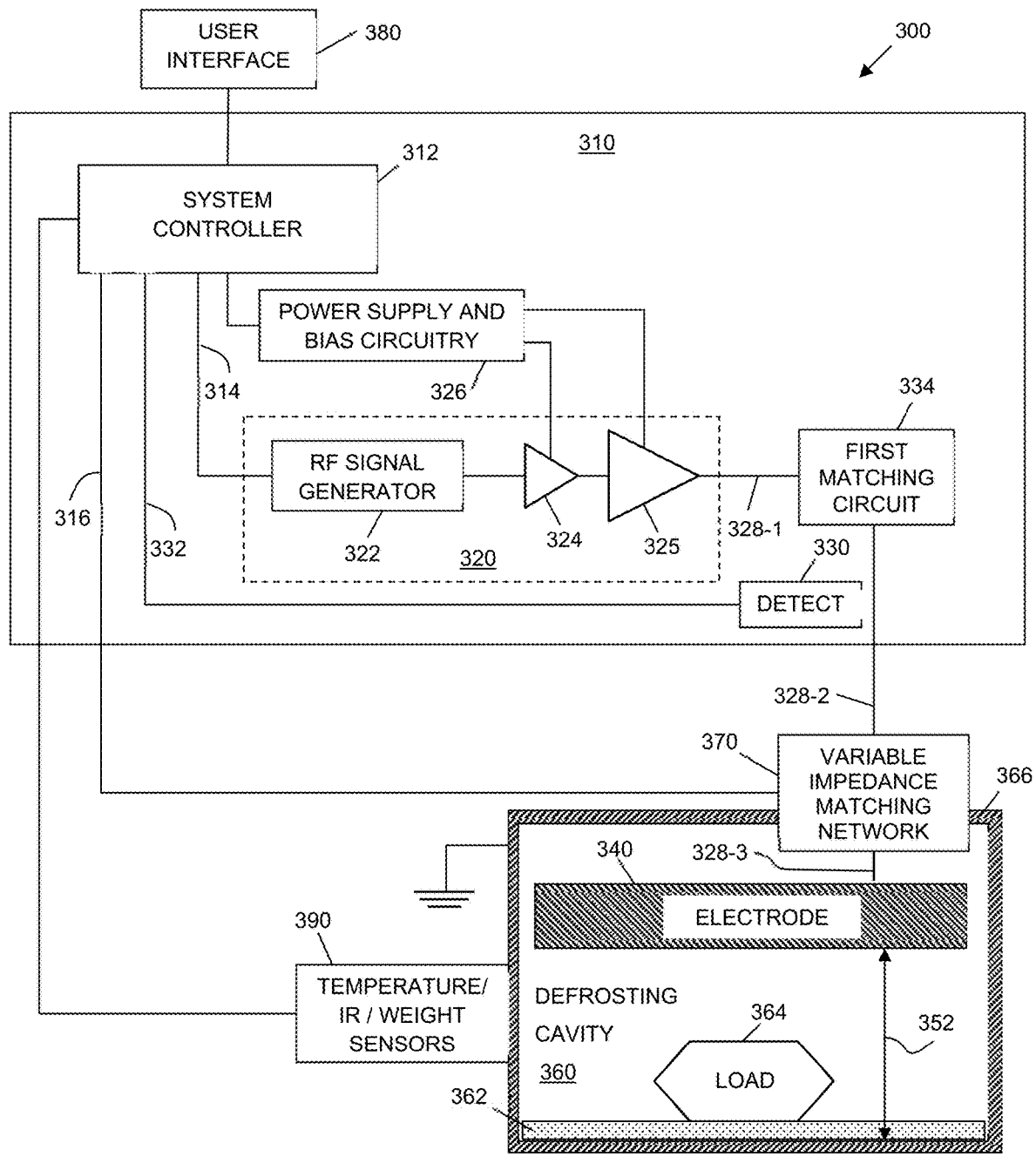
FIG. 3 is a simplified block diagram of an unbalanced defrosting apparatus, in accordance with an example embodiment.
Figure 7:
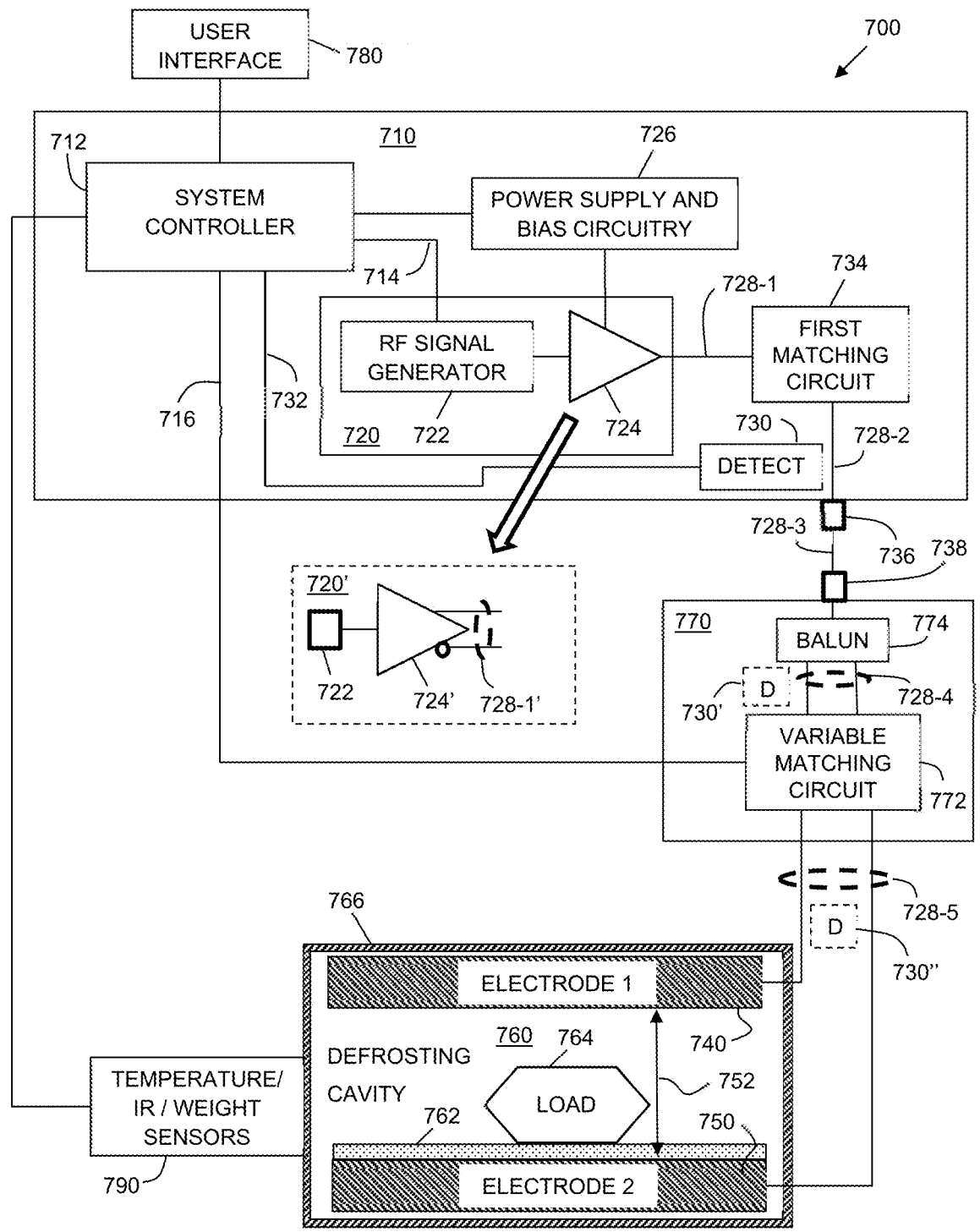
FIG. 7 is a simplified block diagram of a balanced defrosting apparatus, in accordance with another example embodiment.
Figure 11:
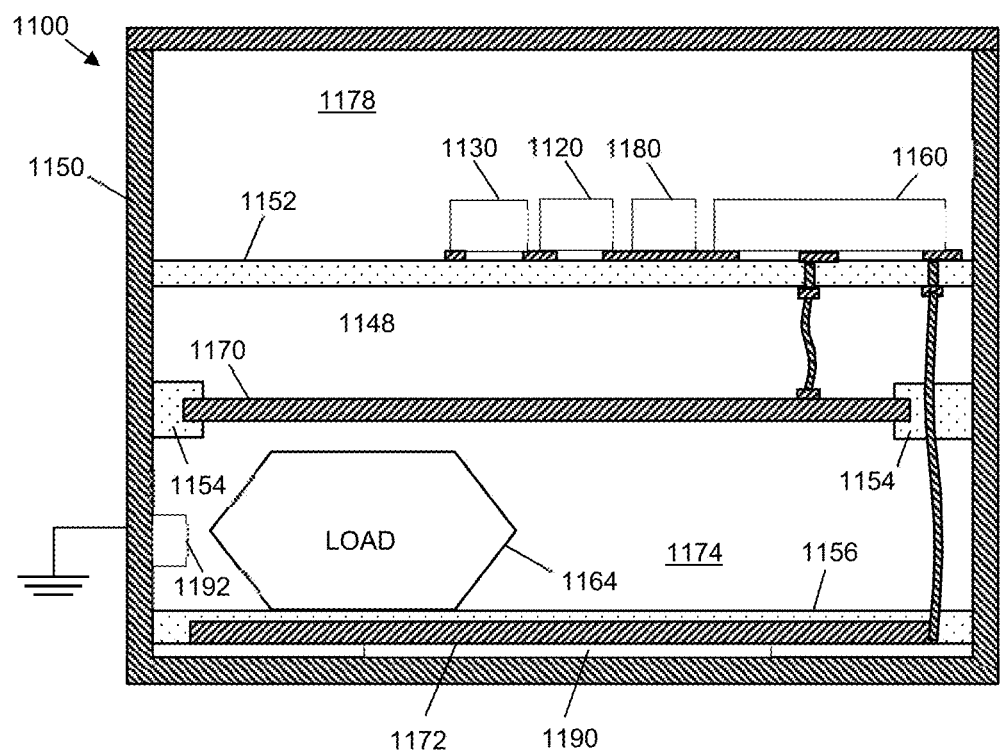
FIG. 11 is a cross-sectional, side view of a defrosting system, in accordance with an example embodiment.

Similar to the defrosting system 100, each of defrosting systems 210, 220 includes a defrosting cavity, a control panel 214, 224, one or more RF signal sources (e.g., RF signal source 320, 720, 1120, FIGS. 3, 7, 11), a power supply (e.g., power supply 326, 726, FIGS. 3, 7), a first electrode (e.g., electrode 340, 740, 1170, FIGS. 3, 7), a second electrode 172 (e.g., containment structure 366, electrode 750, FIGS. 3, 7, 11), impedance matching circuitry (e.g., circuits 334, 370, 734, 772, 1160, FIGS. 3, 7, 11), power detection circuitry (e.g., power detection circuitry 330, 730, 1180, FIGS. 3, 7, 11), and a system controller (e.g., system controller 312, 712, 1130, FIGS. 3, 7, 11). For example, the defrosting cavity may be defined by interior surfaces of bottom, side, front, and back walls of a drawer, and an interior top surface of a fixed shelf 216, 226 under which the drawer slides. With the drawer slid fully under the shelf, the drawer and shelf define the cavity as an enclosed air cavity. The components and functionalities of the defrosting systems 210, 220 may be substantially the same as the components and functionalities of defrosting system 100, in various embodiments.

In addition, according to an embodiment, each of the defrosting systems 210, 220 may have sufficient thermal communication with the freezer or refrigerator compartment 212, 222, respectively, in which the system 210, 220 is disposed. In such an embodiment, after completion of a defrosting operation, the load may be maintained at a safe temperature (i.e., a temperature at which food spoilage is retarded) until the load is removed from the system 210, 220. More specifically, upon completion of a defrosting operation by the freezer-based defrosting system 210, the cavity within which the defrosted load is contained may thermally communicate with the freezer compartment 212, and if the load is not promptly removed from the cavity, the load may re-freeze. Similarly, upon completion of a defrosting operation by the refrigerator-based defrosting system 220, the cavity within which the defrosted load is contained may thermally communicate with the refrigerator compartment 222, and if the load is not promptly removed from the cavity, the load may be maintained in a defrosted state at the temperature within the refrigerator compartment 222.

Those of skill in the art would understand, based on the description herein, that embodiments of defrosting systems may be incorporated into systems or appliances having other configurations, as well. Accordingly, the above-described implementations of defrosting systems in a stand-alone appliance, a microwave oven appliance, a freezer, and a refrigerator are not meant to limit use of the embodiments only to those types of systems.

Although defrosting systems 100, 200 are shown with their components in particular relative orientations with respect to one another, it should be understood that the various components may be oriented differently, as well. In addition, the physical configurations of the various components may be different. For example, control panels 120, 214, 224 may have more, fewer, or different user interface elements, and/or the user interface elements may be differently arranged. In addition, although a substantially cubic defrosting cavity 110 is illustrated in FIG. 1, it should be understood that a defrosting cavity may have a different shape, in other embodiments (e.g., cylindrical, and so on). Further, defrosting systems 100, 210, 220 may include additional components (e.g., a fan, a stationary or rotating plate, a tray, an electrical cord, and so on) that are not specifically depicted in FIGS. 1, 2.

FIG. 3 is a simplified block diagram of an unbalanced defrosting system 300 (e.g., defrosting system 100, 210, 220, FIGS. 1, 2), in accordance with an example embodiment. Defrosting system 300 includes RF subsystem 310, defrosting cavity 360, user interface 380, system controller 312, RF signal source 320, power supply and bias circuitry 326, variable impedance matching network 370, electrode 340, containment structure 366, and power detection circuitry 330, in an embodiment. In addition, in other embodiments, defrosting system 300 may include temperature sensor(s), infrared (IR) sensor(s), and/or weight sensor(s) 390, although some or all of these sensor components may be excluded. It should be understood that FIG. 3 is a simplified representation of a defrosting system 300 for purposes of explanation and ease of description, and that practical embodiments may include other devices and components to provide additional functions and features, and/or the defrosting system 300 may be part of a larger electrical system.

User interface 380 may correspond to a control panel (e.g., control panel 120, 214, 224, FIGS. 1, 2), for example, which enables a user to provide inputs to the system regarding parameters for a defrosting operation (e.g., characteristics of the load to be defrosted, and so on), start and cancel buttons, mechanical controls (e.g., a door/drawer open latch), and so on. In addition, the user interface may be configured to provide user-perceptible outputs indicating the status of a defrosting operation (e.g., a countdown timer, visible indicia indicating progress or completion of the defrosting operation, and/or audible tones indicating completion of the defrosting operation) and other information.

Some embodiments of defrosting system 300 may include temperature sensor(s), IR sensor(s), and/or weight sensor(s) 390. The temperature sensor(s) and/or IR sensor(s) may be positioned in locations that enable the temperature of the load 364 to be sensed during the defrosting operation. When provided to the system controller 312, the temperature information enables the system controller 312 to alter the power of the RF signal supplied by the RF signal source 320 (e.g., by controlling the bias and/or supply voltages provided by the power supply and bias circuitry 326), to adjust the state of the variable impedance matching network 370, and/or to determine when the defrosting operation should be terminated. The weight sensor(s) are positioned under the load 364, and are configured to provide an estimate of the weight of the load 364 to the system controller 312. The system controller 312 may use this information, for example, to determine a desired power level for the RF signal supplied by the RF signal source 320, to determine an initial setting for the variable impedance matching network 370, and/or to determine an approximate duration for the defrosting operation.

The RF subsystem 310 includes a system controller 312, an RF signal source 320, first impedance matching circuit 334 (herein "first matching circuit"), power supply and bias circuitry 326, and power detection circuitry 330, in an embodiment. System controller 312 may include one or more general purpose or special purpose processors (e.g., a microprocessor, microcontroller, Application Specific Integrated Circuit (ASIC), and so on), volatile and/or non-volatile memory (e.g., Random Access Memory (RAM), Read Only Memory (ROM), flash, various registers, and so on), one or more communication busses, and other components. According to an embodiment, system controller 312 is coupled to user interface 380, RF signal source 320, variable impedance matching network 370, power detection circuitry 330, and sensors 390 (if included). System controller 312 is configured to receive signals indicating user inputs received via user interface 380, and to receive signals indicating RF signal reflected power (and possibly RF signal forward power) from power detection circuitry 330. Responsive to the received signals and measurements, and as will be described in more detail later, system controller 312 provides control signals to the power supply and bias circuitry 326 and to the RF signal generator 322 of the RF signal source 320. In addition, system controller 312 provides control signals to the variable impedance matching network 370, which cause the network 370 to change its state or configuration.

Defrosting cavity 360 includes a capacitive defrosting arrangement with first and second parallel plate electrodes that are separated by an air cavity within which a load 364 to be defrosted may be placed. For example, a first electrode 340 may be positioned above the air cavity, and a second electrode may be provided by a portion of a containment structure 366. More specifically, the containment structure 366 may include bottom, top, and side walls, the interior surfaces of which define the cavity 360 (e.g., cavity 110, FIG. 1). According to an embodiment, the cavity 360 may be sealed (e.g., with a door 116, FIG. 1 or by sliding a drawer closed under a shelf 216, 226, FIG. 2) to contain the electromagnetic energy that is introduced into the cavity 360 during a defrosting operation. The system 300 may include one or more interlock mechanisms that ensure that the seal is intact during a defrosting operation. If one or more of the interlock mechanisms indicates that the seal is breached, the system controller 312 may cease the defrosting operation. According to an embodiment, the containment structure 366 is at least partially formed from conductive material, and the conductive portion(s) of the containment structure may be grounded. Alternatively, at least the portion of the containment structure 366 that corresponds to the bottom surface of the cavity 360 may be formed from conductive material and grounded. Either way, the containment structure 366 (or at least the portion of the containment structure 366 that is parallel with the first electrode 340) functions as a second electrode of the capacitive defrosting arrangement. To avoid direct contact between the load 364 and the grounded bottom surface of the cavity 360, a non-conductive barrier 362 may be positioned over the bottom surface of the cavity 360.

Essentially, defrosting cavity 360 includes a capacitive defrosting arrangement with first and second parallel plate electrodes 340, 366 that are separated by an air cavity within which a load 364 to be defrosted may be placed. The first electrode 340 is positioned within containment structure 366 to define a distance 352 between the electrode 340 and an opposed surface of the containment structure 366 (e.g., the bottom surface, which functions as a second electrode), where the distance 352 renders the cavity 360 a sub-resonant cavity, in an embodiment.

In various embodiments, the distance 352 is in a range of about 0.10 meters to about 1.0 meter, although the distance may be smaller or larger, as well. According to an embodiment, distance 352 is less than one wavelength of the RF signal produced by the RF subsystem 310. In other words, as mentioned above, the cavity 360 is a sub-resonant cavity. In some embodiments, the distance 352 is less than about half of one wavelength of the RF signal. In other embodiments, the distance 352 is less than about one quarter of one wavelength of the RF signal. In still other embodiments, the distance 352 is less than about one eighth of one wavelength of the RF signal. In still other embodiments, the distance 352 is less than about one 50th of one wavelength of the RF signal. In still other embodiments, the distance 352 is less than about one 100th of one wavelength of the RF signal.

In general, a system 300 designed for lower operational frequencies (e.g., frequencies between 10 MHz and 100 MHz) may be designed to have a distance 352 that is a smaller fraction of one wavelength. For example, when system 300 is designed to produce an RF signal with an operational frequency of about 10 MHz (corresponding to a wavelength of about 30 meters), and distance 352 is selected to be about 0.5 meters, the distance 352 is about one 60th of one wavelength of the RF signal. Conversely, when system 300 is designed for an operational frequency of about 300 MHz (corresponding to a wavelength of about 1 meter), and distance 352 is selected to be about 0.5 meters, the distance 352 is about one half of one wavelength of the RF signal.

With the operational frequency and the distance 352 between electrode 340 and containment structure 366 being selected to define a sub-resonant interior cavity 360, the first electrode 340 and the containment structure 366 are capacitively coupled. More specifically, the first electrode 340 may be analogized to a first plate of a capacitor, the containment structure 366 may be analogized to a second plate of a capacitor, and the load 364, barrier 362, and air within the cavity 360 may be analogized to a capacitor dielectric. Accordingly, the first electrode 340 alternatively may be referred to herein as an "anode," and the containment structure 366 may alternatively be referred to herein as a "cathode."

Essentially, the voltage across the first electrode 340 and the containment structure 366 heats the load 364 within the cavity 360. According to various embodiments, the RF subsystem 310 is configured to generate the RF signal to produce voltages between the electrode 340 and the containment structure 366 in a range of about 90 volts to about 3,000 volts, in one embodiment, or in a range of about 3000 volts to about 10,000 volts, in another embodiment, although the system may be configured to produce lower or higher voltages between the electrode 340 and the containment structure 366, as well.

The first electrode 340 is electrically coupled to the RF signal source 320 through a first matching circuit 334, a variable impedance matching network 370, and a conductive transmission path, in an embodiment. The first matching circuit 334 is configured to perform an impedance transformation from an impedance of the RF signal source 320 (e.g., less than about 10 ohms) to an intermediate impedance (e.g., 50 ohms, 75 ohms, or some other value). According to an embodiment, the conductive transmission path includes a plurality of conductors 328-1, 328-2, and 328-3 connected in series, and referred to collectively as transmission path 328. According to an embodiment, the conductive transmission path 328 is an "unbalanced" path, which is configured to carry an unbalanced RF signal (i.e., a single RF signal referenced against ground). In some embodiments, one or more connectors (not shown, but each having male and female connector portions) may be electrically coupled along the transmission path 328, and the portion of the transmission path 328 between the connectors may comprise a coaxial cable or other suitable connector. Such a connection is shown in FIG. 7 and described later (e.g., including connectors 736, 738 and a conductor 728-3 such as a coaxial cable between the connectors 736, 738).

As will be described in more detail later, the variable impedance matching circuit 370 is configured to perform an impedance transformation from the above-mentioned intermediate impedance to an input impedance of defrosting cavity 320 as modified by the load 364 (e.g., on the order of hundreds or thousands of ohms, such as about 1000 ohms to about 4000 ohms or more). In an embodiment, the variable impedance matching network 370 includes a network of passive components (e.g., inductors, capacitors, resistors).

According to one more specific embodiment, the variable impedance matching network 370 includes a plurality of fixed-value lumped inductors (e.g., inductors 412-414, FIG. 4A) that are positioned within the cavity 360 and which are electrically coupled to the first electrode 340. In addition, the variable impedance matching network 370 includes a plurality of variable inductance networks (e.g., networks 410, 411, 500, FIGS. 4A, 5A), which may be located inside or outside of the cavity 360. According to another more specific embodiment, the variable impedance matching network 370 includes a plurality of variable capacitance networks (e.g., networks 442, 446, 540, FIG. 4B, 5B), which may be located inside or outside of the cavity 360. The inductance or capacitance value provided by each of the variable inductance or capacitance networks is established using control signals from the system controller 312, as will be described in more detail later. In any event, by changing the state of the variable impedance matching network 370 over the course of a defrosting operation to dynamically match the ever-changing cavity input impedance, the amount of RF power that is absorbed by the load 364 may be maintained at a high level despite variations in the load impedance during the defrosting operation.

According to an embodiment, RF signal source 326 includes an RF signal generator 322 and a power amplifier (e.g., including one or more power amplifier stages 324, 325). In response to control signals provided by system controller 312 over connection 314, RF signal generator 322 is configured to produce an oscillating electrical signal having a frequency in the ISM (industrial, scientific, and medical) band, although the system could be modified to support operations in other frequency bands, as well. The RF signal generator 322 may be controlled to produce oscillating signals of different power levels and/or different frequencies, in various embodiments. For example, the RF signal generator 322 may produce a signal that oscillates in a range of about 10.0 megahertz (MHz) to about 100 MHz and/or from about 100 MHz to about 3.0 gigahertz (GHz). Some desirable frequencies may be, for example, 13.56 MHz (+/−5 percent), 27.125 MHz (+/−5 percent), 40.68 MHz (+/−5 percent), and 2.45 GHz (+/−5 percent). In one particular embodiment, for example, the RF signal generator 322 may produce a signal that oscillates in a range of about 40.66 MHz to about 40.70 MHz and at a power level in a range of about 10 decibel-milliwatts (dBm) to about 15 dBm. Alternatively, the frequency of oscillation and/or the power level may be lower or higher.

In the embodiment of FIG. 3, the power amplifier includes a driver amplifier stage 324 and a final amplifier stage 325. The power amplifier is configured to receive the oscillating signal from the RF signal generator 322, and to amplify the signal to produce a significantly higher-power signal at an output of the power amplifier. For example, the output signal may have a power level in a range of about 100 watts to about 400 watts or more. The gain applied by the power amplifier may be controlled using gate bias voltages and/or drain supply voltages provided by the power supply and bias circuitry 326 to each amplifier stage 324, 325. More specifically, power supply and bias circuitry 326 provides bias and supply voltages to each RF amplifier stage 324, 325 in accordance with control signals received from system controller 312.

In an embodiment, each amplifier stage 324, 325 is implemented as a power transistor, such as a field effect transistor (FET), having an input terminal (e.g., a gate or control terminal) and two current carrying terminals (e.g., source and drain terminals). Impedance matching circuits (not illustrated) may be coupled to the input (e.g., gate) of the driver amplifier stage 324, between the driver and final amplifier stages 325, and/or to the output (e.g., drain terminal) of the final amplifier stage 325, in various embodiments. In an embodiment, each transistor of the amplifier stages 324, 325 includes a laterally diffused metal oxide semiconductor FET (LDMOSFET) transistor. However, it should be noted that the transistors are not intended to be limited to any particular semiconductor technology, and in other embodiments, each transistor may be realized as a gallium nitride (GaN) transistor, another type of MOSFET transistor, a bipolar junction transistor (BJT), or a transistor utilizing another semiconductor technology.

In FIG. 3, the power amplifier arrangement is depicted to include two amplifier stages 324, 325 coupled in a particular manner to other circuit components. In other embodiments, the power amplifier arrangement may include other amplifier topologies and/or the amplifier arrangement may include only one amplifier stage (e.g., as shown in the embodiment of amplifier 724, FIG. 7), or more than two amplifier stages. For example, the power amplifier arrangement may include various embodiments of a single-ended amplifier, a Doherty amplifier, a Switch Mode Power Amplifier (SMPA), or another type of amplifier.

Defrosting cavity 360 and any load 364 (e.g., food, liquids, and so on) positioned in the defrosting cavity 360 present a cumulative load for the electromagnetic energy (or RF power) that is radiated into the cavity 360 by the first electrode 340. More specifically, the cavity 360 and the load 364 present an impedance to the system, referred to herein as a "cavity input impedance." The cavity input impedance changes during a defrosting operation as the temperature of the load 364 increases. The cavity input impedance has a direct effect on the magnitude of reflected signal power along the conductive transmission path 328 between the RF signal source 320 and electrodes 340. In most cases, it is desirable to maximize the magnitude of transferred signal power into the cavity 360, and/or to minimize the reflected-to-forward signal power ratio along the conductive transmission path 328.

In order to at least partially match the output impedance of the RF signal generator 320 to the chamber input impedance, a first matching circuit 334 is electrically coupled along the transmission path 328, in an embodiment. The first matching circuit 334 may have any of a variety of configurations. According to an embodiment, the first matching circuit 334 includes fixed components (i.e., components with non-variable component values), although the first matching circuit 334 may include one or more variable components, in other embodiments. For example, the first matching circuit 334 may include any one or more circuits selected from an inductance/capacitance (LC) network, a series inductance network, a shunt inductance network, or a combination of bandpass, high-pass and low-pass circuits, in various embodiments. Essentially, the fixed matching circuit 334 is configured to raise the impedance to an intermediate level between the output impedance of the RF signal generator 320 and the chamber input impedance.

Figure 15:
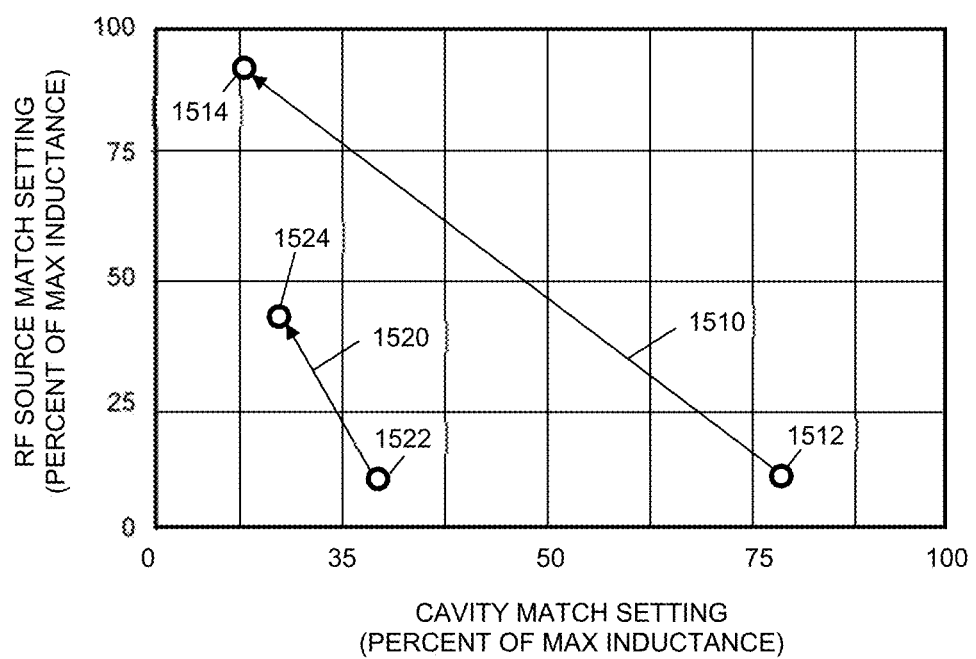
FIG. 15 is a chart plotting cavity match setting versus RF signal source match setting through a defrost operation for two different loads.

As will be described in conjunction with FIG. 15 later, the impedance of many types of food loads changes with respect to temperature in a somewhat predictable manner as the food load transitions from a frozen state to a defrosted state. According to an embodiment, based on reflected power measurements (and forward power measurements, in some embodiments) from the power detection circuitry 330, the system controller 312 is configured to identify a point in time during a defrosting operation when the rate of change of cavity input impedance indicates that the load 364 is approaching 0° Celsius, at which time the system controller 312 may terminate the defrosting operation.

According to an embodiment, power detection circuitry 330 is coupled along the transmission path 328 between the output of the RF signal source 320 and the electrode 340. In a specific embodiment, the power detection circuitry 330 forms a portion of the RF subsystem 310, and is coupled to the conductor 328-2 between the output of the first matching circuit 334 and the input to the variable impedance matching network 370, in an embodiment. In alternate embodiments, the power detection circuitry 330 may be coupled to the portion 328-1 of the transmission path 328 between the output of the RF signal source 320 and the input to the first matching circuit 334, or to the portion 328-3 of the transmission path 328 between the output of the variable impedance matching network 370 and the first electrode 340.

Wherever it is coupled, power detection circuitry 330 is configured to monitor, measure, or otherwise detect the power of the reflected signals traveling along the transmission path 328 between the RF signal source 320 and electrode 340 (i.e., reflected RF signals traveling in a direction from electrode 340 toward RF signal source 320). In some embodiments, power detection circuitry 330 also is configured to detect the power of the forward signals traveling along the transmission path 328 between the RF signal source 320 and the electrode 340 (i.e., forward RF signals traveling in a direction from RF signal source 320 toward electrode 340). Over connection 332, power detection circuitry 330 supplies signals to system controller 312 conveying the magnitudes of the reflected signal power (and the forward signal power, in some embodiments) to system controller 312. In embodiments in which both the forward and reflected signal power magnitudes are conveyed, system controller 312 may calculate a reflected-to-forward signal power ratio, or the S11 parameter. As will be described in more detail below, when the reflected signal power magnitude exceeds a reflected signal power threshold, or when the reflected-to-forward signal power ratio exceeds an S11 parameter threshold, this indicates that the system 300 is not adequately matched to the cavity input impedance, and that energy absorption by the load 364 within the cavity 360 may be sub-optimal. In such a situation, system controller 312 orchestrates a process of altering the state of the variable matching network 370 to drive the reflected signal power or the S11 parameter toward or below a desired level (e.g., below the reflected signal power threshold and/or the reflected-to-forward signal power ratio threshold), thus re-establishing an acceptable match and facilitating more optimal energy absorption by the load 364.

More specifically, the system controller 312 may provide control signals over control path 316 to the variable matching circuit 370, which cause the variable matching circuit 370 to vary inductive, capacitive, and/or resistive values of one or more components within the circuit, thus adjusting the impedance transformation provided by the circuit 370. Adjustment of the configuration of the variable matching circuit 370 desirably decreases the magnitude of reflected signal power, which corresponds to decreasing the magnitude of the S11 parameter and increasing the power absorbed by the load 364.

As discussed above, the variable impedance matching network 370 is used to match the input impedance of the defrosting cavity 360 plus load 364 to maximize, to the extent possible, the RF power transfer into the load 364. The initial impedance of the defrosting cavity 360 and the load 364 may not be known with accuracy at the beginning of a defrosting operation. Further, the impedance of the load 364 changes during a defrosting operation as the load 364 warms up. According to an embodiment, the system controller 312 may provide control signals to the variable impedance matching network 370, which cause modifications to the state of the variable impedance matching network 370. This enables the system controller 312 to establish an initial state of the variable impedance matching network 370 at the beginning of the defrosting operation that has a relatively low reflected to forward power ratio, and thus a relatively high absorption of the RF power by the load 364. In addition, this enables the system controller 312 to modify the state of the variable impedance matching network 370 so that an adequate match may be maintained throughout the defrosting operation, despite changes in the impedance of the load 364.

The variable matching network 370 may have any of a variety of configurations. For example, the network 370 may include any one or more circuits selected from an inductance/capacitance (LC) network, an inductance-only network, a capacitance-only network, or a combination of bandpass, high-pass and low-pass circuits, in various embodiments. In an embodiment, the variable matching network 370 includes a single-ended network (e.g., network 400, FIG. 4). The inductance, capacitance, and/or resistance values provided by the variable matching network 370, which in turn affect the impedance transformation provided by the network 370, are established using control signals from the system controller 312, as will be described in more detail later. In any event, by changing the state of the variable matching network 370 over the course of a defrosting operation to dynamically match the ever-changing impedance of the cavity 360 plus the load 364 within the cavity 360, the system efficiency may be maintained at a high level throughout the defrosting operation.

The variable matching network 370 may have any of a wide variety of circuit configurations, and non-limiting examples of such configurations are shown in FIGS. 4A, 4B, 5A, and 5B. According to an embodiment, as exemplified in FIGS. 4A and 5A, the variable impedance matching network 370 may include a single-ended network of passive components, and more specifically a network of fixed-value inductors (e.g., lumped inductive components) and variable inductors (or variable inductance networks). According to another embodiment, as exemplified in FIGS. 4B and 5B, the variable impedance matching network 370 may include a single-ended network of passive components, and more specifically a network of inductors (e.g., lumped inductive components) and variable capacitors (or variable capacitance networks). As used herein, the term "inductor" means a discrete inductor or a set of inductive components that are electrically coupled together without intervening components of other types (e.g., resistors or capacitors). Similarly, the term "capacitor" means a discrete capacitor or a set of capacitive components that are electrically coupled together without intervening components of other types (e.g., resistors or inductors).

Figure 4A:
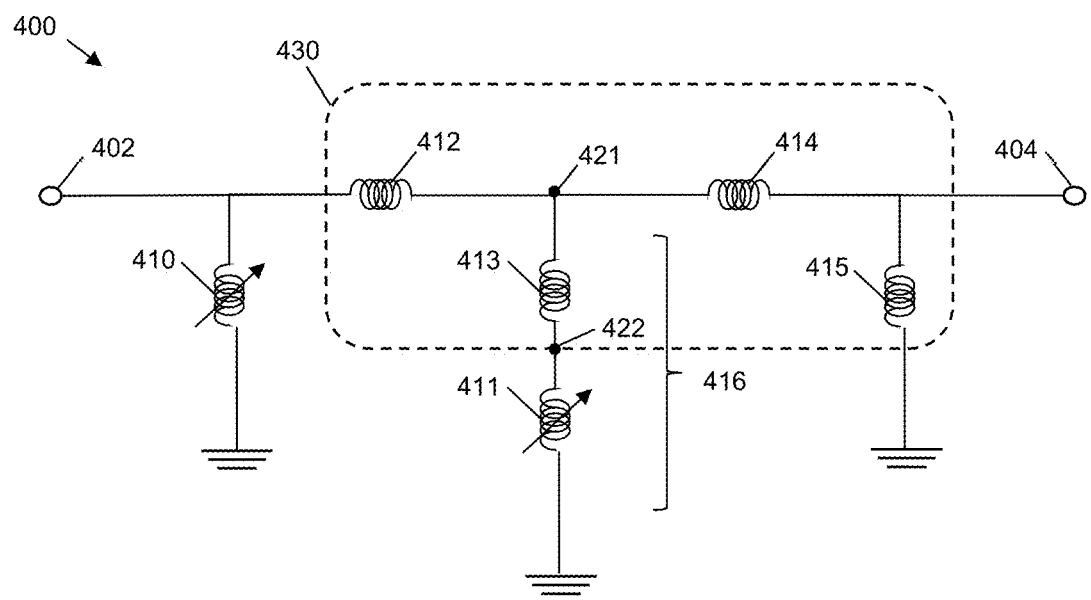
FIG. 4A is a schematic diagram of a single-ended variable inductance matching network, in accordance with an example embodiment.

Referring first to the variable-inductance impedance matching network embodiment, FIG. 4A is a schematic diagram of a single-ended variable impedance matching network 400 (e.g., variable impedance matching network 370, FIG. 3), in accordance with an example embodiment. As will be explained in more detail below, the variable impedance matching network 370 essentially has two portions: one portion to match the RF signal source (or the final stage power amplifier); and another portion to match the cavity plus load.

Variable impedance matching network 400 includes an input node 402, an output node 404, first and second variable inductance networks 410, 411, and a plurality of fixed-value inductors 412-415, according to an embodiment. When incorporated into a defrosting system (e.g., system 300, FIG. 3), the input node 402 is electrically coupled to an output of the RF signal source (e.g., RF signal source 320, FIG. 3), and the output node 404 is electrically coupled to an electrode (e.g., first electrode 340, FIG. 3) within the defrosting cavity (e.g., defrosting cavity 360, FIG. 3).

Between the input and output nodes 402, 404, the variable impedance matching network 400 includes first and second, series coupled lumped inductors 412, 414, in an embodiment. The first and second lumped inductors 412, 414 are relatively large in both size and inductance value, in an embodiment, as they may be designed for relatively low frequency (e.g., about 40.66 MHz to about 40.70 MHz) and high power (e.g., about 50 watts (W) to about 500 W) operation. For example, inductors 412, 414 may have values in a range of about 200 nanohenries (nH) to about 600 nH, although their values may be lower and/or higher, in other embodiments.

The first variable inductance network 410 is a first shunt inductive network that is coupled between the input node 402 and a ground reference terminal (e.g., the grounded containment structure 366, FIG. 3). According to an embodiment, the first variable inductance network 410 is configurable to match the impedance of the RF signal source (e.g., RF signal source 320, FIG. 3) as modified by the first matching circuit (e.g., circuit 334, FIG. 3), or more particularly to match the impedance of the final stage power amplifier (e.g., amplifier 325, FIG. 3) as modified by the first matching circuit 334 (e.g., circuit 334, FIG. 3). Accordingly, the first variable inductance network 410 may be referred to as the "RF signal source matching portion" of the variable impedance matching network 400. According to an embodiment, and as will be described in more detail in conjunction with FIG. 5, the first variable inductance network 410 includes a network of inductive components that may be selectively coupled together to provide inductances in a range of about 10 nH to about 400 nH, although the range may extend to lower or higher inductance values, as well.

In contrast, the "cavity matching portion" of the variable impedance matching network 400 is provided by a second shunt inductive network 416 that is coupled between a node 422 between the first and second lumped inductors 412, 414 and the ground reference terminal. According to an embodiment, the second shunt inductive network 416 includes a third lumped inductor 413 and a second variable inductance network 411 coupled in series, with an intermediate node 422 between the third lumped inductor 413 and the second variable inductance network 411. Because the state of the second variable inductance network 411 may be changed to provide multiple inductance values, the second shunt inductive network 416 is configurable to optimally match the impedance of the cavity plus load (e.g., cavity 360 plus load 364, FIG. 3). For example, inductor 413 may have a value in a range of about 400 nH to about 800 nH, although its value may be lower and/or higher, in other embodiments. According to an embodiment, and as will be described in more detail in conjunction with FIG. 5, the second variable inductance network 411 includes a network of inductive components that may be selectively coupled together to provide inductances in a range of about 50 nH to about 800 nH, although the range may extend to lower or higher inductance values, as well.

Finally, the variable impedance matching network 400 includes a fourth lumped inductor 415 coupled between the output node 404 and the ground reference terminal. For example, inductor 415 may have a value in a range of about 400 nH to about 800 nH, although its value may be lower and/or higher, in other embodiments.

As will be described in more detail in conjunction with FIG. 12A, the set 430 of lumped inductors 412-415 may form a portion of a module that is at least partially physically located within the cavity (e.g., cavity 360, FIG. 3), or at least within the confines of the containment structure (e.g., containment structure 366, FIG. 3). This enables the radiation produced by the lumped inductors 412-415 to be safely contained within the system, rather than being radiated out into the surrounding environment. In contrast, the variable inductance networks 410, 411 may or may not be contained within the cavity or the containment structure, in various embodiments.

According to an embodiment, the variable impedance matching network 400 embodiment of FIG. 4A includes "only inductors" to provide a match for the input impedance of the defrosting cavity 360 plus load 364. Thus, the network 400 may be considered an "inductor-only" matching network. As used herein, the phrases "only inductors" or "inductor-only" when describing the components of the variable impedance matching network means that the network does not include discrete resistors with significant resistance values or discrete capacitors with significant capacitance values. In some cases, conductive transmission lines between components of the matching network may have minimal resistances, and/or minimal parasitic capacitances may be present within the network. Such minimal resistances and/or minimal parasitic capacitances are not to be construed as converting embodiments of the "inductor-only" network into a matching network that also includes resistors and/or capacitors. Those of skill in the art would understand, however, that other embodiments of variable impedance matching networks may include differently configured inductor-only matching networks, and matching networks that include combinations of discrete inductors, discrete capacitors, and/or discrete resistors. As will be described in more detail in conjunction with FIG. 6, an "inductor-only" matching network alternatively may be defined as a matching network that enables impedance matching of a capacitive load using solely or primarily inductive components.

Figure 5A:
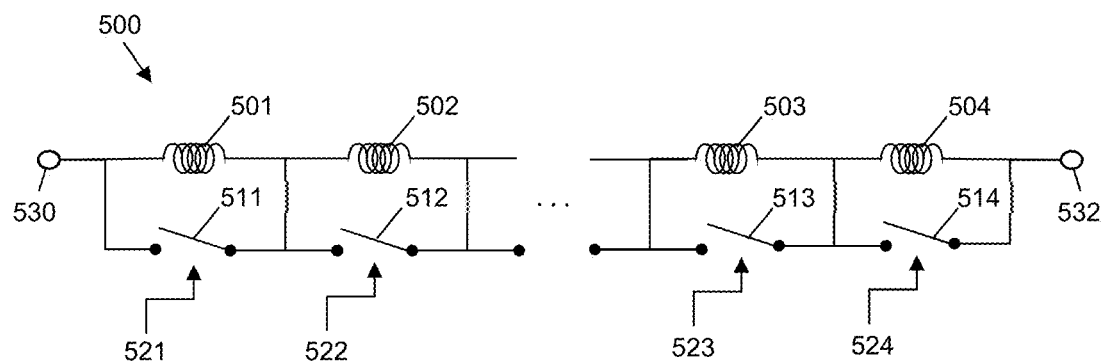
FIG. 5A is a schematic diagram of a single-ended variable inductance network, in accordance with an example embodiment.

FIG. 5A is a schematic diagram of a variable inductance network 500 that may be incorporated into a variable impedance matching network (e.g., as variable inductance networks 410 and/or 411, FIG. 4A), in accordance with an example embodiment. Network 500 includes an input node 530, an output node 532, and a plurality, N, of discrete inductors 501-504 coupled in series with each other between the input and output nodes 530, 532, where N may be an integer between 2 and 10, or more. In addition, network 500 includes a plurality, N, of bypass switches 511-514, where each switch 511-514 is coupled in parallel across the terminals of one of the inductors 501-504. Switches 511-514 may be implemented as transistors, mechanical relays or mechanical switches, for example. The electrically conductive state of each switch 511-514 (i.e., open or closed) is controlled through control signals 521-524 from the system controller (e.g., system controller 312, FIG. 3).

For each parallel inductor/switch combination, substantially all current flows through the inductor when its corresponding switch is in an open or non-conductive state, and substantially all current flows through the switch when the switch is in a closed or conductive state. For example, when all switches 511-514 are open, as illustrated in FIG. 5A, substantially all current flowing between input and output nodes 530, 532 flows through the series of inductors 501-504. This configuration represents the maximum inductance state of the network 500 (i.e., the state of network 500 in which a maximum inductance value is present between input and output nodes 530, 532). Conversely, when all switches 511-514 are closed, substantially all current flowing between input and output nodes 530, 532 bypasses the inductors 501-504 and flows instead through the switches 511-514 and the conductive interconnections between nodes 530, 532 and switches 511-514. This configuration represents the minimum inductance state of the network 500 (i.e., the state of network 500 in which a minimum inductance value is present between input and output nodes 530, 532). Ideally, the minimum inductance value would be near zero inductance. However, in practice a "trace" inductance is present in the minimum inductance state due to the cumulative inductances of the switches 511-514 and the conductive interconnections between nodes 530, 532 and the switches 511-514. For example, in the minimum inductance state, the trace inductance for the variable inductance network 500 may be in a range of about 10 nH to about 50 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through the network 500.

Starting from the maximum inductance state in which all switches 511-514 are open, the system controller may provide control signals 521-524 that result in the closure of any combination of switches 511-514 in order to reduce the inductance of the network 500 by bypassing corresponding combinations of inductors 501-504. In one embodiment, each inductor 501-504 has substantially the same inductance value, referred to herein as a normalized value of I. For example, each inductor 501-504 may have a value in a range of about 10 nH to about 200 nH, or some other value. In such an embodiment, the maximum inductance value for the network 500 (i.e., when all switches 511-514 are in an open state) would be about N×I, plus any trace inductance that may be present in the network 500 when it is in the maximum inductance state. When any n switches are in a closed state, the inductance value for the network 500 would be about (N−n)×I (plus trace inductance). In such an embodiment, the state of the network 500 may be configured to have any of N+1 values of inductance.

In an alternate embodiment, the inductors 501-504 may have different values from each other. For example, moving from the input node 530 toward the output node 532, the first inductor 501 may have a normalized inductance value of I, and each subsequent inductor 502-504 in the series may have a larger or smaller inductance value. For example, each subsequent inductor 502-504 may have an inductance value that is a multiple (e.g., about twice) the inductance value of the nearest downstream inductor 501-503, although the difference may not necessarily be an integer multiple. In such an embodiment, the state of the network 500 may be configured to have any of $2^N$ values of inductance. For example, when N=4 and each inductor 501-504 has a different value, the network 500 may be configured to have any of 16 values of inductance. For example, but not by way of limitation, assuming that inductor 501 has a value of I, inductor 502 has a value of 2×I, inductor 503 has a value of 4×I, and inductor 504 has a value of 8×I, Table 1, below indicates the total inductance value for all 16 possible states of the network 500 (not accounting for trace inductances):

TABLE 1

Total inductance values for all possible variable inductance network states

| Network state | Switch 511 state (501 value = I) | Switch 512 state (502 value = 2 × I) | Switch 513 state (503 value = 4 × I) | Switch 514 state (504 value = 8 × I) | Total network inductance (w/o trace inductance) |
|---|---|---|---|---|---|
| 0 | closed | closed | closed | closed | 0 |
| 1 | open | closed | closed | closed | I |
| 2 | closed | open | closed | closed | 2 × I |
| 3 | open | open | closed | closed | 3 × I |
| 4 | closed | closed | open | closed | 4 × I |
| 5 | open | closed | open | closed | 5 × I |
| 6 | closed | open | open | closed | 6 × I |
| 7 | open | open | open | closed | 7 × I |
| 8 | closed | closed | closed | open | 8 × I |
| 9 | open | closed | closed | open | 9 × I |
| 10 | closed | open | closed | open | 10 × I |
| 11 | open | open | closed | open | 11 × I |
| 12 | closed | closed | open | open | 12 × I |
| 13 | open | closed | open | open | 13 × I |
| 14 | closed | open | open | open | 14 × I |
| 15 | open | open | open | open | 15 × I |

Referring again to FIG. 4A, an embodiment of variable inductance network 410 may be implemented in the form of variable inductance network 500 with the above-described example characteristics (i.e., N=4 and each successive inductor is about twice the inductance of the preceding inductor). Assuming that the trace inductance in the minimum inductance state is about 10 nH, and the range of inductance values achievable by network 410 is about 10 nH (trace inductance) to about 400 nH, the values of inductors 501-504 may be, for example, about 30 nH, about 50 nH, about 100 nH, and about 200 nH, respectively. Similarly, if an embodiment of variable inductance network 411 is implemented in the same manner, and assuming that the trace inductance is about 50 nH and the range of inductance values achievable by network 411 is about 50 nH (trace inductance) to about 800 nH, the values of inductors 501-504 may be, for example, about 50 nH, about 100 nH, about 200 nH, and about 400 nH, respectively. Of course, more or fewer than four inductors 501-504 may be included in either variable inductance network 410, 411, and the inductors within each network 410, 411 may have different values.

Although the above example embodiment specifies that the number of switched inductances in the network 500 equals four, and that each inductor 501-504 has a value that is some multiple of a value of I, alternate embodiments of variable inductance networks may have more or fewer than four inductors, different relative values for the inductors, a different number of possible network states, and/or a different configuration of inductors (e.g., differently connected sets of parallel and/or series coupled inductors). Either way, by providing a variable inductance network in an impedance matching network of a defrosting system, the system may be better able to match the ever-changing cavity input impedance that is present during a defrosting operation.

Figure 4B:
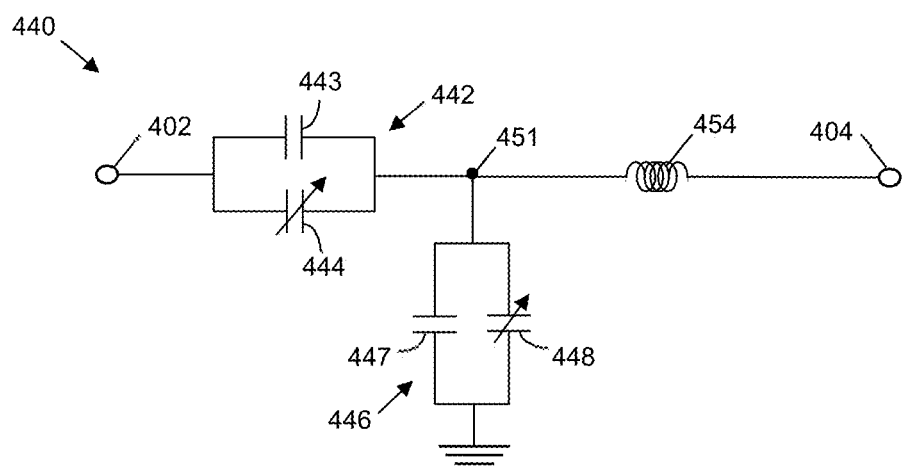
FIG. 4B is a schematic diagram of a single-ended variable capacitive matching network, in accordance with an example embodiment.

FIG. 4B is a schematic diagram of a single-ended variable capacitive matching network 440 (e.g., variable impedance matching network 370, FIG. 3), which may be implemented instead of the variable-inductance impedance matching network 400 (FIG. 4A), in accordance with an example embodiment. Variable impedance matching network 440 includes an input node 402, an output node 404, first and second variable capacitance networks 442, 446, and at least one inductor 454, according to an embodiment. When incorporated into a defrosting system (e.g., system 300, FIG. 3), the input node 402 is electrically coupled to an output of the RF signal source (e.g., RF signal source 320, FIG. 3), and the output node 404 is electrically coupled to an electrode (e.g., first electrode 340, FIG. 3) within the defrosting cavity (e.g., defrosting cavity 360, FIG. 3).

Between the input and output nodes 402, 404, the variable impedance matching network 440 includes a first variable capacitance network 442 coupled in series with an inductor 454, and a second variable capacitance network 446 coupled between an intermediate node 451 and a ground reference terminal (e.g., the grounded containment structure 366, FIG. 3), in an embodiment. The inductor 454 is relatively large in both size and inductance value, in an embodiment, as it may be designed for relatively low frequency (e.g., about 40.66 MHz to about 40.70 MHz) and high power (e.g., about 50 W to about 500 W) operation. For example, inductor 454 may have a value in a range of about 200 nH to about 600 nH, although its value may be lower and/or higher, in other embodiments. According to an embodiment, inductor 454 is a fixed-value, lumped inductor (e.g., a coil). In other embodiments, the inductance value of inductor 454 may be variable.

The first variable capacitance network 442 is coupled between the input node 402 and the intermediate node 451. According to an embodiment, the first variable capacitance network 442 is configurable to match the impedance of the RF signal source (e.g., RF signal source 320, FIG. 3) as modified by the first matching circuit (e.g., circuit 334, FIG. 3), or more particularly to match the impedance of the final stage power amplifier (e.g., amplifier 325, FIG. 3) as modified by the first matching circuit 334 (e.g., circuit 334, FIG. 3). Accordingly, the first variable capacitance network 442 may be referred to as the "RF signal source matching portion" of the variable impedance matching network 440. According to an embodiment, the first variable capacitance network 442 includes a first fixed-value capacitor 443 coupled in parallel with a first variable capacitor 444. The first fixed-value capacitor 443 may have a capacitance value in a range of about 1 picofarad (pF) to about 100 pF, in an embodiment. As will be described in more detail in conjunction with FIG. 5B, the first variable capacitor 444 may include a network of capacitive components that may be selectively coupled together to provide capacitances in a range of 0 pF to about 100 pF. Accordingly, the total capacitance value provided by the first variable capacitance network 442 may be in a range of about 1 pF to about 200 pF, although the range may extend to lower or higher capacitance values, as well.

A "cavity matching portion" of the variable impedance matching network 440 is provided by the second variable capacitance network 446, which is coupled between node 451 (located between the first variable capacitance network 442 and lumped inductor 454) and the ground reference terminal. According to an embodiment, the second variable capacitance network 446 includes a second fixed-value capacitor 447 coupled in parallel with a second variable capacitor 448. The second fixed-value capacitor 447 may have a capacitance value in a range of about 1 pF to about 100 pF, in an embodiment. As will be described in more detail in conjunction with FIG. 5B, the second variable capacitor 448 may include a network of capacitive components that may be selectively coupled together to provide capacitances in a range of 0 pF to about 100 pF. Accordingly, the total capacitance value provided by the second variable capacitance network 446 may be in a range of about 1 pF to about 200 pF, although the range may extend to lower or higher capacitance values, as well. The states of the first and second variable capacitance networks 442, 446 may be changed to provide multiple capacitance values, and thus may be configurable to optimally match the impedance of the cavity plus load (e.g., cavity 360 plus load 364, FIG. 3) to the RF signal source (e.g., RF signal source 320, FIG. 3).

Figure 5B:
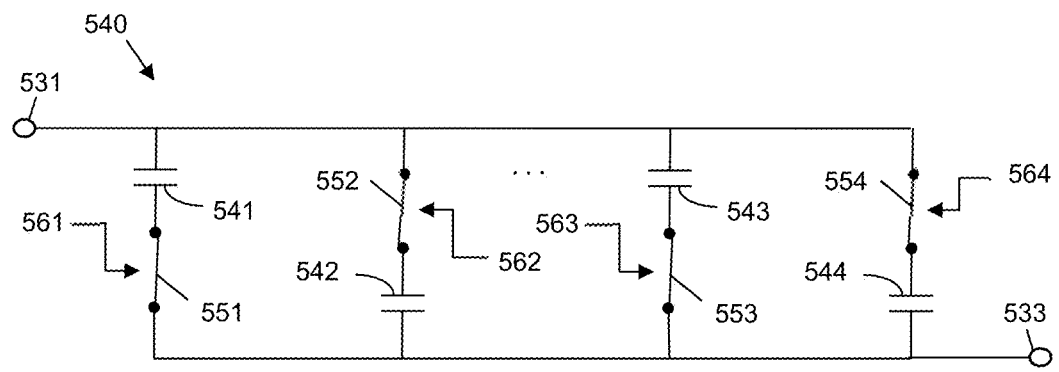
FIG. 5B is a schematic diagram of a single-ended variable capacitive network, in accordance with an example embodiment.

FIG. 5B is a schematic diagram of a single-ended variable capacitive network 540 that may be incorporated into a variable impedance matching network (e.g., for each instance of variable capacitors 444, 448, FIG. 4B), in accordance with an example embodiment. Network 540 includes an input node 531, an output node 533, and a plurality, N, of discrete capacitors 541-544 coupled in parallel with each other between the input and output nodes 531, 533, where N may be an integer between 2 and 10, or more. In addition, network 540 includes a plurality, N, of bypass switches 551-554, where each switch 551-554 is coupled in series with one of the terminals of one of the capacitors 541-544. Switches 551-554 may be implemented as transistors, mechanical relays or mechanical switches, for example. The electrically conductive state of each switch 551-554 (i.e., open or closed) is controlled through control signals 561-564 from the system controller (e.g., system controller 312, FIG. 3). In the embodiment illustrated in FIG. 5B, in each parallel-coupled branch, a single switch is connected to one of the terminals of each capacitor, and the terminal to which the switch is coupled alternates between a bottom terminal (e.g., for capacitors 541 and 543) and a top terminal (e.g., for capacitors 542 and 544) across the series of parallel-coupled capacitors 541-544. In alternate embodiments, the terminal to which the switch is coupled may be the same across the network (e.g., each switch is coupled to a top terminal or to a bottom terminal in each parallel-coupled branch, but not both), or two switches may be coupled to both the top and bottom terminals of each capacitor in each parallel-coupled branch. In the latter embodiment, the two switches coupled to each capacitor may be controlled to open and close in a synchronized manner.

In the illustrated embodiment, for each series capacitor/switch combination in each parallel-coupled branch, substantially all current flows through the capacitor when its corresponding switch is in a closed or conductive state, and substantially zero current flows through the capacitor when the switch is in an open or non-conductive state. For example, when all switches 551-554 are closed, as illustrated in FIG. 5B, substantially all current flowing between input and output nodes 531, 533 flows through the parallel combination of capacitors 541-544. This configuration represents the maximum capacitance state of the network 540 (i.e., the state of network 540 in which a maximum capacitance value is present between input and output nodes 531, 533). Conversely, when all switches 551-554 are open, substantially zero current flows between input and output nodes 531, 533. This configuration represents the minimum capacitance state of the network 540 (i.e., the state of network 540 in which a minimum capacitance value is present between input and output nodes 531, 533).

Starting from the maximum capacitance state in which all switches 551-554 are closed, the system controller may provide control signals 561-564 that result in the opening of any combination of switches 551-554 in order to reduce the capacitance of the network 540 by switching out corresponding combinations of capacitors 541-544. In one embodiment, each capacitor 541-544 has substantially the same capacitance value, referred to herein as a normalized value of J. For example, each capacitor 541-544 may have a value in a range of about 1 pF to about 25 pF, or some other value. In such an embodiment, the maximum capacitance value for the network 540 (i.e., when all switches 551-554 are in a closed state) would be about N×J. When any n switches are in an open state, the capacitance value for the network 540 would be about (N−n)×f. In such an embodiment, the state of the network 540 may be configured to have any of N+1 values of capacitance.

In an alternate embodiment, the capacitors 541-544 may have different values from each other. For example, moving from the input node 531 toward the output node 533, the first capacitor 541 may have a normalized capacitance value of J, and each subsequent capacitor 542-544 in the series may have a larger or smaller capacitance value. For example, each subsequent capacitor 542-544 may have a capacitance value that is a multiple (e.g., about twice) the capacitance value of the nearest downstream capacitor 541-543, although the difference may not necessarily be an integer multiple. In such an embodiment, the state of the network 540 may be configured to have any of $2^N$ values of capacitance. For example, when N=4 and each capacitor 541-544 has a different value, the network 540 may be configured to have any of 16 values of capacitance. For example, but not by way of limitation, assuming that capacitor 541 has a value of J, capacitor 542 has a value of 2×J, capacitor 543 has a value of 4×J, and capacitor 544 has a value of 8×J, the total capacitance value for all 16 possible states of the network 540 may be represented by a table similar to Table 1, above (except switching the value of I for J, and reversing the "open" and "closed" designations).

Figure 6:
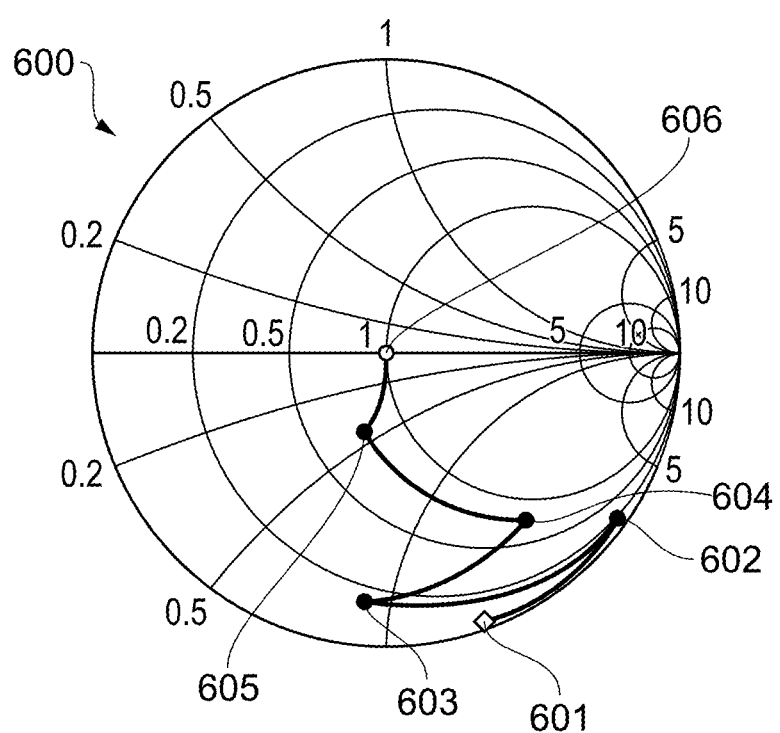
FIG. 6 is an example of a Smith chart depicting how a plurality of variable passive devices in embodiments of a variable impedance matching network may match the input cavity impedance to an RF signal source.

FIG. 6 is an example of a Smith chart 600 depicting how the plurality of inductances in an embodiment of a variable impedance matching network (e.g., network 370, 400, FIGS. 3, 4A) may match the input cavity impedance to the RF signal source. Although not illustrated, a plurality of capacitances in an embodiment of a variable impedance matching network (e.g., network 370, 440, FIGS. 3, 4B) may similarly match the input cavity impedance to the RF signal source. The example Smith chart 600 assumes that the system is a 50 Ohm system, and that the output of the RF signal source is 50 Ohms. Those of skill in the art would understand, based on the description herein, how the Smith chart could be modified for a system and/or RF signal source with different characteristic impedances.

In Smith chart 600, point 601 corresponds to the point at which the load (e.g., the cavity 360 plus load 364, FIG. 3) would locate (e.g., at the beginning of a defrosting operation) absent the matching provided by the variable impedance matching network (e.g., network 370, 400, FIGS. 3, 4A). As indicated by the position of the load point 601 in the lower right quadrant of the Smith chart 600, the load is a capacitive load. According to an embodiment, the shunt and series inductances of the variable impedance matching network sequentially move the substantially-capacitive load impedance toward an optimal matching point 606 (e.g., 50 Ohms) at which RF energy transfer to the load may occur with minimal losses. More specifically, and referring also to FIG. 4A, shunt inductance 415 moves the impedance to point 602, series inductance 414 moves the impedance to point 603, shunt inductance 416 moves the impedance to point 604, series inductance 412 moves the impedance to point 605, and shunt inductance 410 moves the impedance to the optimal matching point 606.

It should be noted that the combination of impedance transformations provided by embodiments of the variable impedance matching network keep the impedance at any point within or very close to the lower right quadrant of the Smith chart 600. As this quadrant of the Smith chart 600 is characterized by relatively high impedances and relatively low currents, the impedance transformation is achieved without exposing components of the circuit to relatively high and potentially damaging currents. Accordingly, an alternate definition of an "inductor-only" matching network, as used herein, may be a matching network that enables impedance matching of a capacitive load using solely or primarily inductive components, where the impedance matching network performs the transformation substantially within the lower right quadrant of the Smith chart.

As discussed previously, the impedance of the load changes during the defrosting operation. Accordingly, point 601 correspondingly moves during the defrosting operation. Movement of load point 601 is compensated for, according to the previously-described embodiments, by varying the impedance of the first and second shunt inductances 410, 411 so that the final match provided by the variable impedance matching network still may arrive at or near the optimal matching point 606. Although a specific variable impedance matching network has been illustrated and described herein, those of skill in the art would understand, based on the description herein, that differently-configured variable impedance matching networks may achieve the same or similar results to those conveyed by Smith chart 600. For example, alternative embodiments of a variable impedance matching network may have more or fewer shunt and/or series inductances, and or different ones of the inductances may be configured as variable inductance networks (e.g., including one or more of the series inductances). Accordingly, although a particular variable inductance matching network has been illustrated and described herein, the inventive subject matter is not limited to the illustrated and described embodiment.

The description associated with FIGS. 3-6 discuss, in detail, an "unbalanced" defrosting apparatus, in which an RF signal is applied to one electrode (e.g., electrode 340, FIG. 3), and the other "electrode" (e.g., the containment structure 366, FIG. 3) is grounded. As mentioned above, an alternate embodiment of a defrosting apparatus comprises a "balanced" defrosting apparatus. In such an apparatus, balanced RF signals are provided to both electrodes.

For example, FIG. 7 is a simplified block diagram of a balanced defrosting system 700 (e.g., defrosting system 100, 210, 220, FIGS. 1, 2), in accordance with an example embodiment. Defrosting system 700 includes RF subsystem 710, defrosting cavity 760, user interface 780, system controller 712, RF signal source 720, power supply and bias circuitry 726, variable impedance matching network 770, two electrodes 740, 750, and power detection circuitry 730, in an embodiment. In addition, in other embodiments, defrosting system 700 may include temperature sensor(s), infrared (IR) sensor(s), and/or weight sensor(s) 790, although some or all of these sensor components may be excluded. It should be understood that FIG. 7 is a simplified representation of a defrosting system 700 for purposes of explanation and ease of description, and that practical embodiments may include other devices and components to provide additional functions and features, and/or the defrosting system 700 may be part of a larger electrical system.

User interface 780 may correspond to a control panel (e.g., control panel 120, 214, 224, FIGS. 1, 2), for example, which enables a user to provide inputs to the system regarding parameters for a defrosting operation (e.g., characteristics of the load to be defrosted, and so on), start and cancel buttons, mechanical controls (e.g., a door/drawer open latch), and so on. In addition, the user interface may be configured to provide user-perceptible outputs indicating the status of a defrosting operation (e.g., a countdown timer, visible indicia indicating progress or completion of the defrosting operation, and/or audible tones indicating completion of the defrosting operation) and other information.

The RF subsystem 710 includes a system controller 712, an RF signal source 720, a first impedance matching circuit 734 (herein "first matching circuit"), power supply and bias circuitry 726, and power detection circuitry 730, in an embodiment. System controller 712 may include one or more general purpose or special purpose processors (e.g., a microprocessor, microcontroller, ASIC, and so on), volatile and/or non-volatile memory (e.g., RAM, ROM, flash, various registers, and so on), one or more communication busses, and other components. According to an embodiment, system controller 712 is operatively and communicatively coupled to user interface 780, RF signal source 720, power supply and bias circuitry 726, power detection circuitry 730 (or 730' or 730"), variable matching subsystem 770, sensor(s) 790 (if included), and pump 792 (if included). System controller 712 is configured to receive signals indicating user inputs received via user interface 780, to receive signals indicating RF signal reflected power (and possibly RF signal forward power) from power detection circuitry 730 (or 730' or 730"), and to receive sensor signals from sensor(s) 790. Responsive to the received signals and measurements, and as will be described in more detail later, system controller 712 provides control signals to the power supply and bias circuitry 726 and/or to the RF signal generator 722 of the RF signal source 720. In addition, system controller 712 provides control signals to the variable matching subsystem 770 (over path 716), which cause the subsystem 770 to change the state or configuration of a variable impedance matching circuit 772 of the subsystem 770 (herein "variable matching circuit").

Defrosting cavity 760 includes a capacitive defrosting arrangement with first and second parallel plate electrodes 740, 750 that are separated by an air cavity within which a load 764 to be defrosted may be placed. Within a containment structure 766, first and second electrodes 740, 750 (e.g., electrodes 140, 150, FIG. 1) are positioned in a fixed physical relationship with respect to each other on either side of an interior defrosting cavity 760 (e.g., interior cavity 260, FIG. 2). According to an embodiment, a distance 752 between the electrodes 740, 750 renders the cavity 760 a sub-resonant cavity, in an embodiment.

The first and second electrodes 740, 750 are separated across the cavity 760 by a distance 752. In various embodiments, the distance 752 is in a range of about 0.10 meters to about 1.0 meter, although the distance may be smaller or larger, as well. According to an embodiment, distance 752 is less than one wavelength of the RF signal produced by the RF subsystem 710. In other words, as mentioned above, the cavity 760 is a sub-resonant cavity. In some embodiments, the distance 752 is less than about half of one wavelength of the RF signal. In other embodiments, the distance 752 is less than about one quarter of one wavelength of the RF signal. In still other embodiments, the distance 752 is less than about one eighth of one wavelength of the RF signal. In still other embodiments, the distance 752 is less than about one 50th of one wavelength of the RF signal. In still other embodiments, the distance 752 is less than about one 100th of one wavelength of the RF signal.

In general, a system 700 designed for lower operational frequencies (e.g., frequencies between 10 MHz and 100 MHz) may be designed to have a distance 752 that is a smaller fraction of one wavelength. For example, when system 700 is designed to produce an RF signal with an operational frequency of about 10 MHz (corresponding to a wavelength of about 30 meters), and distance 752 is selected to be about 0.5 meters, the distance 752 is about one 60th of one wavelength of the RF signal. Conversely, when system 700 is designed for an operational frequency of about 300 MHz (corresponding to a wavelength of about 1 meter), and distance 752 is selected to be about 0.5 meters, the distance 752 is about one half of one wavelength of the RF signal.

With the operational frequency and the distance 752 between electrodes 740, 750 being selected to define a sub-resonant interior cavity 760, the first and second electrodes 740, 750 are capacitively coupled. More specifically, the first electrode 740 may be analogized to a first plate of a capacitor, the second electrode 750 may be analogized to a second plate of a capacitor, and the load 764, barrier 762, and air within the cavity 760 may be analogized to a capacitor dielectric. Accordingly, the first electrode 740 alternatively may be referred to herein as an "anode," and the second electrode 750 may alternatively be referred to herein as a "cathode."

Essentially, the voltage across the first and second electrodes 740, 750 heats the load 764 within the cavity 760. According to various embodiments, the RF subsystem 710 is configured to generate the RF signal to produce voltages across the electrodes 740, 750 in a range of about 70 volts to about 3000 volts, in one embodiment, or in a range of about 3000 volts to about 10,000 volts, in another embodiment, although the system may be configured to produce lower or higher voltages across electrodes 740, 750, as well.

An output of the RF subsystem 710, and more particularly an output of RF signal source 720, is electrically coupled to the variable matching subsystem 770 through a conductive transmission path, which includes a plurality of conductors 728-1, 728-2, 728-3, 728-4, and 728-5 connected in series, and referred to collectively as transmission path 728. According to an embodiment, the conductive transmission path 728 includes an "unbalanced" portion and a "balanced" portion, where the "unbalanced" portion is configured to carry an unbalanced RF signal (i.e., a single RF signal referenced against ground), and the "balanced" portion is configured to carry a balanced RF signal (i.e., two signals referenced against each other). The "unbalanced" portion of the transmission path 728 may include unbalanced first and second conductors 728-1, 728-2 within the RF subsystem 710, one or more connectors 736, 738 (each having male and female connector portions), and an unbalanced third conductor 728-3 electrically coupled between the connectors 736, 738. According to an embodiment, the third conductor 728-3 comprises a coaxial cable, although the electrical length may be shorter or longer, as well. In an alternate embodiment, the variable matching subsystem 770 may be housed with the RF subsystem 710, and in such an embodiment, the conductive transmission path 728 may exclude the connectors 736, 738 and the third conductor 728-3. Either way, the "balanced" portion of the conductive transmission path 728 includes a balanced fourth conductor 728-4 within the variable matching subsystem 770, and a balanced fifth conductor 728-5 electrically coupled between the variable matching subsystem 770 and electrodes 740, 750, in an embodiment.

As indicated in FIG. 7, the variable matching subsystem 770 houses an apparatus configured to receive, at an input of the apparatus, the unbalanced RF signal from the RF signal source 720 over the unbalanced portion of the transmission path (i.e., the portion that includes unbalanced conductors 728-1, 728-2, and 728-3), to convert the unbalanced RF signal into two balanced RF signals (e.g., two RF signals having a phase difference between 120 and 240 degrees, such as about 180 degrees), and to produce the two balanced RF signals at two outputs of the apparatus. For example, the conversion apparatus may be a balun 774, in an embodiment. The balanced RF signals are conveyed over balanced conductors 728-4 to the variable matching circuit 772 and, ultimately, over balanced conductors 728-5 to the electrodes 740, 750.

In an alternate embodiment, as indicated in a dashed box in the center of FIG. 7, and as will be discussed in more detail below, an alternate RF signal generator 720' may produce balanced RF signals on balanced conductors 728-1', which may be directly coupled to the variable matching circuit 772 (or coupled through various intermediate conductors and connectors). In such an embodiment, the balun 774 may be excluded from the system 700. Either way, as will be described in more detail below, a double-ended variable matching circuit 772 (e.g., variable matching circuit 800, 900, 1000, FIGS. 8-10) is configured to receive the balanced RF signals (e.g., over connections 728-4 or 728-1'), to perform an impedance transformation corresponding to a then-current configuration of the double-ended variable matching circuit 772, and to provide the balanced RF signals to the first and second electrodes 740, 750 over connections 728-5.

According to an embodiment, RF signal source 720 includes an RF signal generator 722 and a power amplifier 724 (e.g., including one or more power amplifier stages). In response to control signals provided by system controller 712 over connection 714, RF signal generator 722 is configured to produce an oscillating electrical signal having a frequency in an ISM (industrial, scientific, and medical) band, although the system could be modified to support operations in other frequency bands, as well. The RF signal generator 722 may be controlled to produce oscillating signals of different power levels and/or different frequencies, in various embodiments. For example, the RF signal generator 722 may produce a signal that oscillates in a range of about 10.0 MHz to about 100 MHz and/or from about 100 MHz to about 3.0 GHz. Some desirable frequencies may be, for example, 13.56 MHz (+/−5 percent), 27.125 MHz (+/−5 percent), 40.68 MHz (+/−5 percent), and 2.45 GHz (+/−5 percent). Alternatively, the frequency of oscillation may be lower or higher than the above-given ranges or values.

The power amplifier 724 is configured to receive the oscillating signal from the RF signal generator 722, and to amplify the signal to produce a significantly higher-power signal at an output of the power amplifier 724. For example, the output signal may have a power level in a range of about 100 watts to about 400 watts or more, although the power level may be lower or higher, as well. The gain applied by the power amplifier 724 may be controlled using gate bias voltages and/or drain bias voltages provided by the power supply and bias circuitry 726 to one or more stages of amplifier 724. More specifically, power supply and bias circuitry 726 provides bias and supply voltages to the inputs and/or outputs (e.g., gates and/or drains) of each RF amplifier stage in accordance with control signals received from system controller 712.

The power amplifier may include one or more amplification stages. In an embodiment, each stage of amplifier 724 is implemented as a power transistor, such as a FET, having an input terminal (e.g., a gate or control terminal) and two current carrying terminals (e.g., source and drain terminals). Impedance matching circuits (not illustrated) may be coupled to the input (e.g., gate) and/or output (e.g., drain terminal) of some or all of the amplifier stages, in various embodiments. In an embodiment, each transistor of the amplifier stages includes an LDMOS FET. However, it should be noted that the transistors are not intended to be limited to any particular semiconductor technology, and in other embodiments, each transistor may be realized as a GaN transistor, another type of MOS FET transistor, a BJT, or a transistor utilizing another semiconductor technology.

In FIG. 7, the power amplifier arrangement 724 is depicted to include one amplifier stage coupled in a particular manner to other circuit components. In other embodiments, the power amplifier arrangement 724 may include other amplifier topologies and/or the amplifier arrangement may include two or more amplifier stages (e.g., as shown in the embodiment of amplifier 324/325, FIG. 3). For example, the power amplifier arrangement may include various embodiments of a single-ended amplifier, a double-ended (balanced) amplifier, a push-pull amplifier, a Doherty amplifier, a Switch Mode Power Amplifier (SMPA), or another type of amplifier.

For example, as indicated in the dashed box in the center of FIG. 7, an alternate RF signal generator 720' may include a push-pull or balanced amplifier 724', which is configured to receive, at an input, an unbalanced RF signal from the RF signal generator 722, to amplify the unbalanced RF signal, and to produce two balanced RF signals at two outputs of the amplifier 724', where the two balanced RF signals are thereafter conveyed over conductors 728-1' to the electrodes 740, 750. In such an embodiment, the balun 774 may be excluded from the system 700, and the conductors 728-1' may be directly connected to the variable matching circuit 772 (or connected through multiple coaxial cables and connectors or other multi-conductor structures).

Defrosting cavity 760 and any load 764 (e.g., food, liquids, and so on) positioned in the defrosting cavity 760 present a cumulative load for the electromagnetic energy (or RF power) that is radiated into the interior chamber 762 by the electrodes 740, 750. More specifically, and as described previously, the defrosting cavity 760 and the load 764 present an impedance to the system, referred to herein as a "cavity plus load impedance." The cavity plus load impedance changes during a defrosting operation as the temperature of the load 764 increases. The cavity plus load impedance has a direct effect on the magnitude of reflected signal power along the conductive transmission path 728 between the RF signal source 720 and the electrodes 740, 750. In most cases, it is desirable to maximize the magnitude of transferred signal power into the cavity 760, and/or to minimize the reflected-to-forward signal power ratio along the conductive transmission path 728.

In order to at least partially match the output impedance of the RF signal generator 720 to the chamber input impedance, a first matching circuit 734 is electrically coupled along the transmission path 728, in an embodiment. The first matching circuit 734 is configured to perform an impedance transformation from an impedance of the RF signal source 720 (e.g., less than about 10 ohms) to an intermediate impedance (e.g., 50 ohms, 75 ohms, or some other value). The first matching circuit 734 may have any of a variety of configurations. According to an embodiment, the first matching circuit 734 includes fixed components (i.e., components with non-variable component values), although the first matching circuit 734 may include one or more variable components, in other embodiments. For example, the first matching circuit 734 may include any one or more circuits selected from an inductance/capacitance (LC) network, a series inductance network, a shunt inductance network, or a combination of bandpass, high-pass and low-pass circuits, in various embodiments. Essentially, the first matching circuit 734 is configured to raise the impedance to an intermediate level between the output impedance of the RF signal generator 720 and the cavity plus load impedance.

According to an embodiment, and as mentioned above, power detection circuitry 730 is coupled along the transmission path 728 between the output of the RF signal source 720 and the electrodes 740, 750. In a specific embodiment, the power detection circuitry 730 forms a portion of the RF subsystem 710, and is coupled to the conductor 728-2 between the RF signal source 720 and connector 736. In alternate embodiments, the power detection circuitry 730 may be coupled to any other portion of the transmission path 728, such as to conductor 728-1, to conductor 728-3, to conductor 728-4 between the RF signal source 720 (or balun 774) and the variable matching circuit 772 (i.e., as indicated with power detection circuitry 730'), or to conductor 728-5 between the variable matching circuit 772 and the electrode(s) 740, 750 (i.e., as indicated with power detection circuitry 730"). For purposes of brevity, the power detection circuitry is referred to herein with reference number 730, although the circuitry may be positioned in other locations, as indicated by reference numbers 730' and 730".

Wherever it is coupled, power detection circuitry 730 is configured to monitor, measure, or otherwise detect the power of the reflected signals traveling along the transmission path 728 between the RF signal source 720 and one or both of the electrode(s) 740, 750 (i.e., reflected RF signals traveling in a direction from electrode(s) 740, 750 toward RF signal source 720). In some embodiments, power detection circuitry 730 also is configured to detect the power of the forward signals traveling along the transmission path 728 between the RF signal source 720 and the electrode(s) 740, 750 (i.e., forward RF signals traveling in a direction from RF signal source 720 toward electrode(s) 740, 750).

Over connection 732, power detection circuitry 730 supplies signals to system controller 712 conveying the measured magnitudes of the reflected signal power, and in some embodiments, also the measured magnitude of the forward signal power. In embodiments in which both the forward and reflected signal power magnitudes are conveyed, system controller 712 may calculate a reflected-to-forward signal power ratio, or the S11 parameter. As will be described in more detail below, when the reflected signal power magnitude exceeds a reflected signal power threshold, or when the reflected-to-forward signal power ratio exceeds an S11 parameter threshold, this indicates that the system 700 is not adequately matched to the cavity plus load impedance, and that energy absorption by the load 764 within the cavity 760 may be sub-optimal. In such a situation, system controller 712 orchestrates a process of altering the state of the variable matching circuit 772 to drive the reflected signal power or the S11 parameter toward or below a desired level (e.g., below the reflected signal power threshold and/or the reflected-to-forward signal power ratio threshold), thus re-establishing an acceptable match and facilitating more optimal energy absorption by the load 764.

More specifically, the system controller 712 may provide control signals over control path 716 to the variable matching circuit 772, which cause the variable matching circuit 772 to vary inductive, capacitive, and/or resistive values of one or more components within the circuit, thus adjusting the impedance transformation provided by the circuit 772. Adjustment of the configuration of the variable matching circuit 772 desirably decreases the magnitude of reflected signal power, which corresponds to decreasing the magnitude of the S11 parameter and increasing the power absorbed by the load 764.

As discussed above, the variable matching circuit 772 is used to match the input impedance of the defrosting cavity 760 plus load 764 to maximize, to the extent possible, the RF power transfer into the load 764. The initial impedance of the defrosting cavity 760 and the load 764 may not be known with accuracy at the beginning of a defrosting operation. Further, the impedance of the load 764 changes during a defrosting operation as the load 764 warms up. According to an embodiment, the system controller 712 may provide control signals to the variable matching circuit 772, which cause modifications to the state of the variable matching circuit 772. This enables the system controller 712 to establish an initial state of the variable matching circuit 772 at the beginning of the defrosting operation that has a relatively low reflected to forward power ratio, and thus a relatively high absorption of the RF power by the load 764. In addition, this enables the system controller 712 to modify the state of the variable matching circuit 772 so that an adequate match may be maintained throughout the defrosting operation, despite changes in the impedance of the load 764.

The variable matching circuit 772 may have any of a variety of configurations. For example, the circuit 772 may include any one or more circuits selected from an inductance/capacitance (LC) network, an inductance-only network, a capacitance-only network, or a combination of bandpass, high-pass and low-pass circuits, in various embodiments. In an embodiment in which the variable matching circuit 772 is implemented in a balanced portion of the transmission path 728, the variable matching circuit 772 is a double-ended circuit with two inputs and two outputs. In an alternate embodiment in which the variable matching circuit is implemented in an unbalanced portion of the transmission path 728, the variable matching circuit may be a single-ended circuit with a single input and a single output (e.g., similar to matching circuit 400 or 440, FIGS. 4A, 4B). According to a more specific embodiment, the variable matching circuit 772 includes a variable inductance network (e.g., double-ended network 800, 900, FIGS. 8, 9). According to another more specific embodiment, the variable matching circuit 772 includes a variable capacitance network (e.g., double-ended network 1000, FIG. 10). In still other embodiments, the variable matching circuit 772 may include both variable inductance and variable capacitance elements. The inductance, capacitance, and/or resistance values provided by the variable matching circuit 772, which in turn affect the impedance transformation provided by the circuit 772, are established through control signals from the system controller 712, as will be described in more detail later. In any event, by changing the state of the variable matching circuit 772 over the course of a treatment operation to dynamically match the ever-changing impedance of the cavity 760 plus the load 764 within the cavity 760, the system efficiency may be maintained at a high level throughout the defrosting operation.

Figure 8:
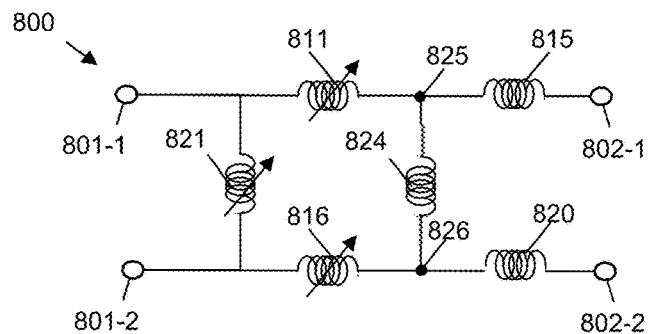
FIG. 8 is a schematic diagram of a double-ended variable impedance matching network with variable inductances, in accordance with another example embodiment.
Figure 9:
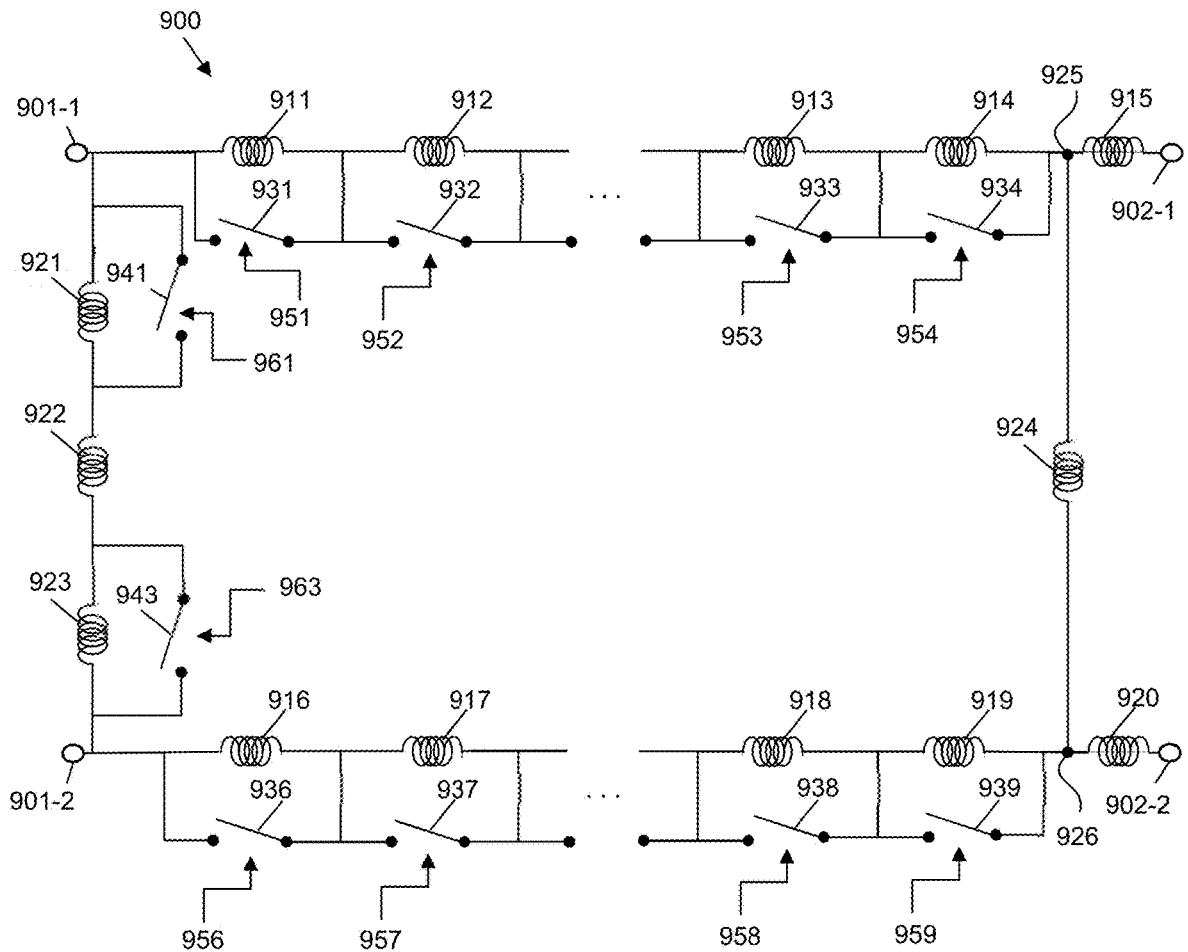
FIG. 9 is a schematic diagram of a double-ended variable impedance network with variable inductances, in accordance with another example embodiment.
Figure 10:
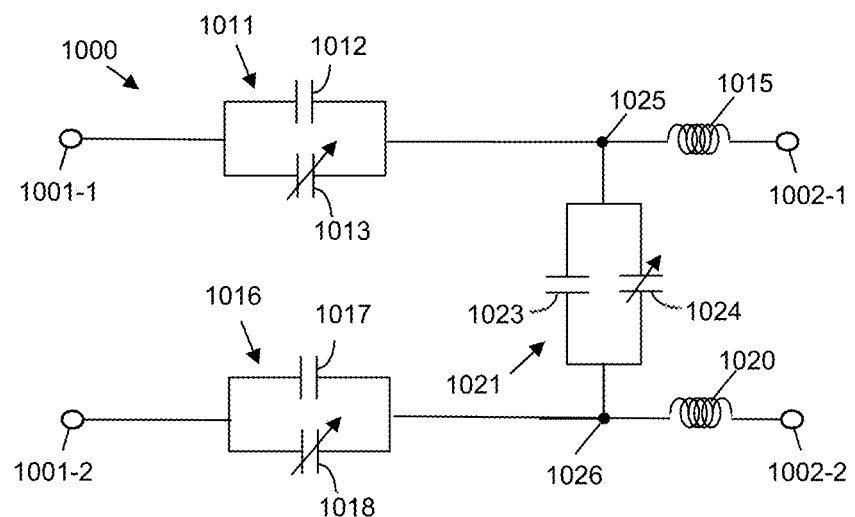
FIG. 10 is a schematic diagram of a double-ended variable impedance network with variable capacitances, in accordance with another example embodiment.

The variable matching circuit 772 may have any of a wide variety of circuit configurations, and non-limiting examples of such configurations are shown in FIGS. 8-10. For example, FIG. 8 is a schematic diagram of a double-ended variable impedance matching circuit 800 that may be incorporated into a defrosting system (e.g., system 80, 200, 700, FIGS. 1, 2, 7), in accordance with an example embodiment. According to an embodiment, the variable matching circuit 800 includes a network of fixed-value and variable passive components.

Circuit 800 includes a double-ended input 801-1, 801-2 (referred to as input 801), a double-ended output 802-1, 802-2 (referred to as output 802), and a network of passive components connected in a ladder arrangement between the input 801 and output 802. For example, when connected into system 700, the first input 801-1 may be connected to a first conductor of balanced conductor 728-4, and the second input 801-2 may be connected to a second conductor of balanced conductor 728-4. Similarly, the first output 802-1 may be connected to a first conductor of balanced conductor 728-5, and the second output 802-2 may be connected to a second conductor of balanced conductor 728-5.

In the specific embodiment illustrated in FIG. 8, circuit 800 includes a first variable inductor 811 and a first fixed inductor 815 connected in series between input 801-1 and output 802-1, a second variable inductor 816 and a second fixed inductor 820 connected in series between input 801-2 and output 802-2, a third variable inductor 821 connected between inputs 801-1 and 801-2, and a third fixed inductor 824 connected between nodes 825 and 826.

According to an embodiment, the third variable inductor 821 corresponds to an "RF signal source matching portion", which is configurable to match the impedance of the RF signal source (e.g., RF signal source 720, FIG. 7) as modified by the first matching circuit (e.g., circuit 734, FIG. 7), or more particularly to match the impedance of the final stage power amplifier (e.g., amplifier 724, FIG. 7) as modified by the first matching circuit (e.g., circuit 734, FIG. 7). According to an embodiment, the third variable inductor 821 includes a network of inductive components that may be selectively coupled together to provide inductances in a range of about 5 nH to about 200 nH, although the range may extend to lower or higher inductance values, as well.

In contrast, the "cavity matching portion" of the variable impedance matching network 800 is provided by the first and second variable inductors 811, 816, and fixed inductors 815, 820, and 824. Because the states of the first and second variable inductors 811, 816 may be changed to provide multiple inductance values, the first and second variable inductors 811, 816 are configurable to optimally match the impedance of the cavity plus load (e.g., cavity 760 plus load 764, FIG. 7). For example, inductors 811, 816 each may have a value in a range of about 10 nH to about 200 nH, although their values may be lower and/or higher, in other embodiments.

The fixed inductors 815, 820, 824 also may have inductance values in a range of about 50 nH to about 800 nH, although the inductance values may be lower or higher, as well. Inductors 811, 815, 816, 820, 821, 824 may include discrete inductors, distributed inductors (e.g., printed coils), wirebonds, transmission lines, and/or other inductive components, in various embodiments. In an embodiment, variable inductors 811 and 816 are operated in a paired manner, meaning that their inductance values during operation are controlled to be equal to each other, at any given time, in order to ensure that the RF signals conveyed to outputs 802-1 and 802-2 are balanced.

As discussed above, variable matching circuit 800 is a double-ended circuit that is configured to be connected along a balanced portion of the transmission path 728 (e.g., between connectors 728-4 and 728-5), and other embodiments may include a single-ended (i.e., one input and one output) variable matching circuit that is configured to be connected along the unbalanced portion of the transmission path 728.

By varying the inductance values of inductors 811, 816, 821 in circuit 800, the system controller 712 may increase or decrease the impedance transformation provided by circuit 800. Desirably, the inductance value changes improve the overall impedance match between the RF signal source 720 and the cavity plus load impedance, which should result in a reduction of the reflected signal power and/or the reflected-to-forward signal power ratio. In most cases, the system controller 712 may strive to configure the circuit 800 in a state in which a maximum electromagnetic field intensity is achieved in the cavity 760, and/or a maximum quantity of power is absorbed by the load 764, and/or a minimum quantity of power is reflected by the load 764.

FIG. 9 is a schematic diagram of a double-ended variable impedance matching network 900, in accordance with another example embodiment. Network 900 includes a double-ended input 901-1, 901-2 (referred to as input 901), a double-ended output 902-1, 902-2 (referred to as output 902), and a network of passive components connected in a ladder arrangement between the input 901 and output 902. The ladder arrangement includes a first plurality, N, of discrete inductors 911-914 coupled in series with each other between input 901-1 and output 902-1, where N may be an integer between 2 and 10, or more. The ladder arrangement also includes a second plurality, N, of discrete inductors 916-919 coupled in series with each other between input 901-2 and output 902-2. Additional discrete inductors 915 and 920 may be coupled between intermediate nodes 925, 926 and the output nodes 902-1, 902-2. Further still, the ladder arrangement includes a third plurality of discrete inductors 921-923 coupled in series with each other between inputs 901-1 and 901-2, and an additional discrete inductor 924 coupled between nodes 925 and 926. For example, the fixed inductors 915, 920, 924 each may have inductance values in a range of about 50 nH to about 800 nH, although the inductance values may be lower or higher, as well.

The series arrangement of inductors 911-914 may be considered a first variable inductor (e.g., inductor 811, FIG. 8), the series arrangement of inductors 916-919 may be considered a second variable inductor (e.g., inductor 816, FIG. 80), and series arrangement of inductors 921-923 may be considered a third variable inductor (e.g., inductor 8021, FIG. 8). To control the variability of the "variable inductors", network 900 includes a plurality of bypass switches 931-934, 936-939, 941, and 943, where each switch 931-934, 936-939, 941, and 943 is coupled in parallel across the terminals of one of inductors 911-914, 916-919, 921, and 923. Switches 931-934, 936-939, 941, and 943 may be implemented as transistors, mechanical relays or mechanical switches, for example. The electrically conductive state of each switch 931-934, 936-939, 941, and 943 (i.e., open or closed) is controlled using control signals 951-954, 956-959, 961, 963 from the system controller (e.g., control signals from system controller 712 provided over connection 716, FIG. 7).

In an embodiment, sets of corresponding inductors in the two paths between input 901 and output 902 have substantially equal values, and the conductive state of the switches for each set of corresponding inductors is operated in a paired manner, meaning that the switch states during operation are controlled to be the same as each other, at any given time, in order to ensure that the RF signals conveyed to outputs 902-1 and 902-2 are balanced. For example, inductors 911 and 916 may constitute a first "set of corresponding inductors" or "paired inductors" with substantially equal values, and during operation, the states of switches 931 and 936 are controlled to be the same (e.g., either both open or both closed), at any given time. Similarly, inductors 912 and 917 may constitute a second set of corresponding inductors with equal inductance values that are operated in a paired manner, inductors 913 and 918 may constitute a third set of corresponding inductors with equal inductance values that are operated in a paired manner, and inductors 914 and 919 may constitute a fourth set of corresponding inductors with equal inductance values that are operated in a paired manner.

For each parallel inductor/switch combination, substantially all current flows through the inductor when its corresponding switch is in an open or non-conductive state, and substantially all current flows through the switch when the switch is in a closed or conductive state. For example, when all switches 931-934, 936-939, 941, and 943 are open, as illustrated in FIG. 9, substantially all current flowing between input and output nodes 901-1, 902-1 flows through the series of inductors 911-915, and substantially all current flowing between input and output nodes 901-2, 902-2 flows through the series of inductors 916-920 (as modified by any current flowing through inductors 921-923 or 924). This configuration represents the maximum inductance state of the network 900 (i.e., the state of network 900 in which a maximum inductance value is present between input and output nodes 901, 902). Conversely, when all switches 931-934, 936-939, 941, and 943 are closed, substantially all current flowing between input and output nodes 901, 902 bypasses the inductors 911-914 and 916-919 and flows instead through the switches 931-934 or 936-939, inductors 915 or 920, and the conductive interconnections between the input and output nodes 901, 902 and switches 931-934, 936-939. This configuration represents the minimum inductance state of the network 900 (i.e., the state of network 900 in which a minimum inductance value is present between input and output nodes 901, 902). Ideally, the minimum inductance value would be near zero inductance. However, in practice a relatively small inductance is present in the minimum inductance state due to the cumulative inductances of the switches 931-934 or 936-939, inductors 915 or 920, and the conductive interconnections between nodes 901, 902 and the switches 931-934 or 936-939. For example, in the minimum inductance state, a trace inductance for the series combination of switches 931-934 or 936-939 may be in a range of about 10 nH to about 400 nH, although the trace inductance may be smaller or larger, as well. Larger, smaller, or substantially similar trace inductances also may be inherent in each of the other network states, as well, where the trace inductance for any given network state is a summation of the inductances of the sequence of conductors and switches through which the current primarily is carried through the network 900.

Starting from the maximum inductance state in which all switches 931-934, 936-939 are open, the system controller may provide control signals 951-954, 956-959 that result in the closure of any combination of switches 931-934, 936-939 in order to reduce the inductance of the network 900 by bypassing corresponding combinations of inductors 911-914, 916-919.

Similar to the embodiment of FIG. 8, in circuit 900, the first and second pluralities of discrete inductors 911-914, 916-919 and fixed inductor 924 correspond to a "cavity matching portion" of the circuit. Similar to the embodiment described above in conjunction with FIG. 5A, in one embodiment, each inductor 911-914, 916-919 has substantially the same inductance value, referred to herein as a normalized value of I. For example, each inductor 911-914, 916-919 may have a value in a range of about 1 nH to about 400 nH, or some other value. In such an embodiment, the maximum inductance value between input node 901-1 and 902-2, and the maximum inductance value between input node 901-2 and 902-2 (i.e., when all switches 931-934, 936-939 are in an open state) would be about N×I, plus any trace inductance that may be present in the network 900 when it is in the maximum inductance state. When any n switches are in a closed state, the inductance value between corresponding input and output nodes would be about (N−n)×I (plus trace inductance).

As also explained in conjunction with FIG. 5A, above, in an alternate embodiment, the inductors 911-914, 916-919 may have different values from each other. For example, moving from the input node 901-1 toward the output node 902-1, the first inductor 911 may have a normalized inductance value of I, and each subsequent inductor 912-914 in the series may have a larger or smaller inductance value. Similarly, moving from the input node 901-2 toward the output node 902-2, the first inductor 916 may have a normalized inductance value of I, and each subsequent inductor 917-919 in the series may have a larger or smaller inductance value. For example, each subsequent inductor 912-914 or 917-919 may have an inductance value that is a multiple (e.g., about twice or half) the inductance value of the nearest downstream inductor 911-914 or 916-918. The example of Table 1, above, applies also to the first series inductance path between input and output nodes 901-1 and 902-1, and the second series inductance path between input and output nodes 901-2 and 902-1. More specifically, inductor/switch combinations 911/931 and 916/956 each are analogous to inductor/switch combination 501/511, inductor/switch combinations 912/932 and 917/957 each are analogous to inductor/switch combination 502/512, inductor/switch combinations 913/933 and 918/958 each are analogous to inductor/switch combination 503/513, and inductor/switch combinations 914/934 and 919/959 each are analogous to inductor/switch combination 504/514.

Assuming that the trace inductance through series inductors 911-914 in the minimum inductance state is about 10 nH, and the range of inductance values achievable by the series inductors 911-914 is about 10 nH (trace inductance) to about 400 nH, the values of inductors 911-914 may be, for example, about 10 nH, about 20 nH, about 40 nH, about 80 nH, and about 160 nH, respectively. The combination of series inductors 916-919 may be similarly or identically configured. Of course, more or fewer than four inductors 911-914 or 916-919 may be included in either series combination between input and output nodes 901-1/902-1 or 901-2/902-2, and the inductors within each series combination may have different values from the example values given above.

Although the above example embodiment specifies that the number of switched inductances in each series combination between corresponding input and output nodes equals four, and that each inductor 911-914, 916-919 has a value that is some multiple of a value of I, alternate embodiments of variable series inductance networks may have more or fewer than four inductors, different relative values for the inductors, and/or a different configuration of inductors (e.g., differently connected sets of parallel and/or series coupled inductors). Either way, by providing a variable inductance network in an impedance matching network of a defrosting system, the system may be better able to match the ever-changing cavity plus load impedance that is present during a defrosting operation.

As with the embodiment of FIG. 8, the third plurality of discrete inductors 921-923 corresponds to an "RF signal source matching portion" of the circuit. The third variable inductor comprises the series arrangement of inductors 921-923, where bypass switches 941 and 943 enable inductors 921 and 923 selectively to be connected into the series arrangement or bypassed based on control signals 961 and 963. In an embodiment, each of inductors 921-923 may have equal values (e.g., values in a range of about 1 nH to about 100 nH. In an alternate embodiment, the inductors 921-923 may have different values from each other. Inductor 922 is electrically connected between input terminals 901-1 and 901-2 regardless of the state of bypass switches 941 and 943. Accordingly, the inductance value of inductor 922 serves as a baseline (i.e., minimum) inductance between input terminals 901-1 and 901-2. According to an embodiment, the first and third inductors 921, 923 may have inductance values that are a ratio of each other. For example, when the first inductor 921 has a normalized inductance value of J, inductor 923 may have a value of 2*J, 3*J, 4*J, or some other ratio, in various embodiments.

FIG. 10 is a schematic diagram of a double-ended variable impedance matching circuit 1000 that may be incorporated into a defrosting system (e.g., system 100, 200, 700, FIGS. 1, 2, 7), in accordance with another example embodiment. As with the matching circuits 800, 900 (FIGS. 8 and 9), according to an embodiment, the variable matching circuit 1000 includes a network of fixed-value and variable passive components.

Circuit 1000 includes a double-ended input 1001-1, 1001-2 (referred to as input 1001), a double-ended output 1002-1, 1002-2 (referred to as output 1002), and a network of passive components connected between the input 1001 and output 1002. For example, when connected into system 700, the first input 1001-1 may be connected to a first conductor of balanced conductor 728-4, and the second input 1001-2 may be connected to a second conductor of balanced conductor 728-4. Similarly, the first output 1002-1 may be connected to a first conductor of balanced conductor 728-5, and the second output 1002-2 may be connected to a second conductor of balanced conductor 728-5.

In the specific embodiment illustrated in FIG. 10, circuit 1000 includes a first variable capacitance network 1011 and a first inductor 1015 connected in series between input 1001-1 and output 1002-1, a second variable capacitance network 1016 and a second inductor 1020 connected in series between input 1001-2 and output 1002-2, and a third variable capacitance network 1021 connected between nodes 1025 and 1026. The inductors 1015, 1020 are relatively large in both size and inductance value, in an embodiment, as they may be designed for relatively low frequency (e.g., about 40.66 MHz to about 40.70 MHz) and high power (e.g., about 50 W to about 500 W) operation. For example, inductors 1015, 1020 each may have a value in a range of about 100 nH to about 1000 nH (e.g., in a range of about 200 nH to about 600 nH), although their values may be lower and/or higher, in other embodiments. According to an embodiment, inductors 1015, 1020 are fixed-value, lumped inductors (e.g., coils, discrete inductors, distributed inductors (e.g., printed coils), wirebonds, transmission lines, and/or other inductive components, in various embodiments). In other embodiments, the inductance value of inductors 1015, 1020 may be variable. In any event, the inductance values of inductors 1015, 1020 are substantially the same either permanently (when inductors 1015, 1020 are fixed-value) or at any given time (when inductors 1015, 1020 are variable, they are operated in a paired manner), in an embodiment.

The first and second variable capacitance networks 1011, 1016 correspond to "series matching portions" of the circuit 1000. According to an embodiment, the first variable capacitance network 1011 includes a first fixed-value capacitor 1012 coupled in parallel with a first variable capacitor 1013. The first fixed-value capacitor 1012 may have a capacitance value in a range of about 1 pF to about 100 pF, in an embodiment. As was described previously in conjunction with FIG. 5B, the first variable capacitor 1013 may include a network of capacitive components that may be selectively coupled together to provide capacitances in a range of 0 pF to about 100 pF. Accordingly, the total capacitance value provided by the first variable capacitance network 1011 may be in a range of about 1 pF to about 200 pF, although the range may extend to lower or higher capacitance values, as well.

Similarly, the second variable capacitance network 1016 includes a second fixed-value capacitor 1017 coupled in parallel with a second variable capacitor 1018. The second fixed-value capacitor 1017 may have a capacitance value in a range of about 1 pF to about 100 pF, in an embodiment. As was described previously in conjunction with FIG. 5B, the second variable capacitor 1018 may include a network of capacitive components that may be selectively coupled together to provide capacitances in a range of 0 pF to about 100 pF. Accordingly, the total capacitance value provided by the second variable capacitance network 1016 may be in a range of about 1 pF to about 200 pF, although the range may extend to lower or higher capacitance values, as well.

In any event, to ensure the balance of the signals provided to outputs 1002-1 and 1002-2, the capacitance values of the first and second variable capacitance networks 1011, 1016 are controlled to be substantially the same at any given time, in an embodiment. For example, the capacitance values of the first and second variable capacitors 1013, 1018 may be controlled so that the capacitance values of the first and second variable capacitance networks 1011, 1016 are substantially the same at any given time. The first and second variable capacitors 1013, 1018 are operated in a paired manner, meaning that their capacitance values during operation are controlled, at any given time, to ensure that the RF signals conveyed to outputs 1002-1 and 1002-2 are balanced. The capacitance values of the first and second fixed-value capacitors 1012, 1017 may be substantially the same, in some embodiments, although they may be different, in others.

The "shunt matching portion" of the variable impedance matching network 1000 is provided by the third variable capacitance network 1021 and fixed inductors 1015, 1020. According to an embodiment, the third variable capacitance network 1021 includes a third fixed-value capacitor 1023 coupled in parallel with a third variable capacitor 1024. The third fixed-value capacitor 1023 may have a capacitance value in a range of about 1 pF to about 500 pF, in an embodiment. As was described previously in conjunction with FIG. 5B, the third variable capacitor 1024 may include a network of capacitive components that may be selectively coupled together to provide capacitances in a range of 0 pF to about 200 pF. Accordingly, the total capacitance value provided by the third variable capacitance network 1021 may be in a range of about 1 pF to about 700 pF, although the range may extend to lower or higher capacitance values, as well.

Because the states of the variable capacitance networks 1011, 1016, 1021 may be changed to provide multiple capacitance values, the variable capacitance networks 1011, 1016, 1021 are configurable to optimally match the impedance of the cavity plus load (e.g., cavity 760 plus load 764, FIG. 7) to the RF signal source (e.g., RF signal source 720, 720', FIG. 7). By varying the capacitance values of capacitors 1013, 1018, 1024 in circuit 1000, the system controller (e.g., system controller 712, FIG. 7) may increase or decrease the impedance transformation provided by circuit 1000. Desirably, the capacitance value changes improve the overall impedance match between the RF signal source 720 and the impedance of the cavity plus load, which should result in a reduction of the reflected signal power and/or the reflected-to-forward signal power ratio. In most cases, the system controller 712 may strive to configure the circuit 1000 in a state in which a maximum electromagnetic field intensity is achieved in the cavity 760, and/or a maximum quantity of power is absorbed by the load 764, and/or a minimum quantity of power is reflected by the load 764.

It should be understood that the variable impedance matching circuits 800, 900, 100 illustrated in FIGS. 8-10 are but three possible circuit configurations that may perform the desired double-ended variable impedance transformations. Other embodiments of double-ended variable impedance matching circuits may include differently arranged inductive or capacitive networks, or may include passive networks that include various combinations of inductors, capacitors, and/or resistors, where some of the passive components may be fixed-value components, and some of the passive components may be variable-value components (e.g., variable inductors, variable capacitors, and/or variable resistors). Further, the double-ended variable impedance matching circuits may include active devices (e.g., transistors) that switch passive components into and out of the network to alter the overall impedance transformation provided by the circuit.

A particular physical configuration of a defrosting system will now be described in conjunction with FIG. 11. More particularly, FIG. 11 is a cross-sectional, side view of a defrosting system 1100, in accordance with an example embodiment. The defrosting system 1100 generally includes a defrosting cavity 1174, a user interface (not shown), a system controller 1130, an RF signal source 1120, power supply and bias circuitry (not shown), power detection circuitry 1180, a variable impedance matching network 1160, a first electrode 1170, and a second electrode 1172, in an embodiment. According to an embodiment, the system controller 1130, RF signal source 1120, power supply and bias circuitry, and power detection circuitry 1180, may form portions of a first module (e.g., RF module 1300, FIG. 13), and the variable impedance matching network 1160 may form portions of a second module (e.g., either module 1200 or 1240, FIGS. 12A, 12B). In addition, in some embodiments, defrosting system 1100 may include weight sensor(s) 1190, temperature sensor(s), and/or IR sensor(s) 1192.

The defrosting system 1100 is contained within a containment structure 1150, in an embodiment. According to an embodiment, the containment structure 1150 may define two or more interior areas, such as the defrosting cavity 1174 and a circuit housing area 1178. The containment structure 1150 includes bottom, top, and side walls. Portions of the interior surfaces of some of the walls of the containment structure 1150 may define the defrosting cavity 1174. The defrosting cavity 1174 includes a capacitive defrosting arrangement with first and second parallel plate electrodes 1170, 1172 that are separated by an air cavity within which a load 1164 to be defrosted may be placed. For example, the first electrode 1170 may be positioned above the air cavity, and a second electrode 1172 may be, in the single-ended system embodiment, provided by a conductive portion of the containment structure 1150 (e.g., a portion of the bottom wall of the containment structure 1150). Alternatively, in the single- or double-ended system embodiments, the second electrode 1172 may be formed from a conductive plate, as shown, that is distinct from the containment structure 1150. According to an embodiment, non-electrically conductive support structure(s) 1154 may be employed to suspend the first electrode 1170 above the air cavity, to electrically isolate the first electrode 1170 from the containment structure 1150, and to hold the first electrode 1170 in a fixed physical orientation with respect to the air cavity. In addition, to avoid direct contact between the load 1164 and the second electrode 1172, a non-conductive support and barrier structure 1156 may be positioned over the bottom surface of the containment structure 1150.

According to an embodiment, the containment structure 1150 is at least partially formed from conductive material, and the conductive portion(s) of the containment structure may be grounded to provide a ground reference for various electrical components of the system. Alternatively, at least the portion of the containment structure 1150 that corresponds to the second electrode 1172 may be formed from conductive material and grounded.

When included in the system 1100, the weight sensor(s) 1190 are positioned under the load 1164. The weight sensor(s) 1190 are configured to provide an estimate of the weight of the load 1164 to the system controller 1130. The temperature sensor(s) and/or IR sensor(s) 1192 may be positioned in locations that enable the temperature of the load 1164 to be sensed both before, during, and after a defrosting operation. According to an embodiment, the temperature sensor(s) and/or IR sensor(s) 1192 are configured to provide load temperature estimates to the system controller 1130.

Some or all of the various components of the system controller 1130, the RF signal source 1120, the power supply and bias circuitry (not shown), the power detection circuitry 1180, and the variable impedance matching network 1160, may be coupled to one or more common substrates (e.g., substrate 1152) within the circuit housing area 1178 of the containment structure 1150, in an embodiment. For example, some of all of the above-listed components may be included in an RF module (e.g., RF module 1300, FIG. 13) and a variable impedance matching circuit module (e.g., a variation of module 1200 or 1240, FIGS. 12A, 12B), which are housed within the circuit housing area 1178 of the containment structure 1150. According to an embodiment, the system controller 1130 is coupled to the user interface, RF signal source 1120, variable impedance matching network 1160, and power detection circuitry 1180 through various conductive interconnects on or within the common substrate 1152, and/or through various cables (e.g., coaxial cables), not shown. In addition, the power detection circuitry 1180 is coupled along the transmission path 1148 between the output of the RF signal source 1120 and the input to the variable impedance matching network 1160, in an embodiment. For example, the substrate 1152 (or the substrates defining an RF module 1300 or variable impedance matching network module 1200, 1240) may include a microwave or RF laminate, a polytetrafluoroethylene (PTFE) substrate, a printed circuit board (PCB) material substrate (e.g., FR-4), an alumina substrate, a ceramic tile, or another type of substrate. In various alternate embodiments, various ones of the components may be coupled to different substrates with electrical interconnections between the substrates and components. In still other alternate embodiments, some or all of the components may be coupled to a cavity wall, rather than being coupled to a distinct substrate.

In either a single-ended or double-ended embodiment, the first electrode 1170 is electrically coupled to the RF signal source 1120 through a variable impedance matching network 1160 and a transmission path 1148, in an embodiment. In a double-ended embodiment, the second electrode 1172 also is electrically coupled to the RF signal source 1120 through a variable impedance matching network 1160 and a transmission path 1148. As discussed previously, single-ended embodiments of the variable impedance matching network 1160 may include a single-ended variable inductance network (e.g., network 400, FIG. 4A) or a single-ended variable capacitance network (e.g., network 440, FIG. 4B). Alternatively, double-ended embodiments of the variable impedance matching network 1160 may include a double-ended variable inductance network (e.g., network 800, 900, FIGS. 8, 9) or a double-ended variable capacitance network (e.g., network 1000, FIG. 10). In an embodiment, the variable impedance matching network 1160 is implemented as a module (e.g., one of modules 1200, 1240, FIGS. 12A, 12B), or is coupled to the common substrate 1152 and located within the circuit housing area 1178. Conductive structures (e.g., conductive vias, traces, cables, wires, and other structures) may provide for electrical communication between the circuitry within the circuit housing area 1178 and electrodes 1170, 1172.

According to various embodiments, the circuitry associated with the single-ended or double-ended variable impedance matching networks discussed herein may be implemented in the form of one or more modules, where a "module" is defined herein as an assembly of electrical components coupled to a common substrate. For example, FIGS. 12A and 12B are a perspective views of examples of modules 1200, 1240 that include a double-ended variable impedance matching network (e.g., networks 800, 900, 1000, FIGS. 8-10), in accordance with two example embodiments. More specifically, FIG. 12A illustrates a module 1200 that houses a variable inductance impedance matching network (e.g., networks 800, 900, FIGS. 8, 9), and FIG. 12B illustrates a module 1240 that houses a variable capacitance impedance matching network (e.g., network 1000, FIG. 10).

Each of the modules 1200, 1240 includes a printed circuit board (PCB) 1204, 1244 with a front side 1206, 1246 and an opposite back side 1208, 1248. The PCB 1204, 1244 is formed from one or more dielectric layers, and two or more printed conductive layers. Conductive vias (not visible in FIGS. 12A, 12B) may provide for electrical connections between the multiple conductive layers. At the front side 1206, 1246, a plurality of printed conductive traces formed from a first printed conductive layer provides for electrical connectivity between the various components that are coupled to the front side 1206, 1246 of the PCB 1204, 1244. Similarly, at the back side 1208, 1248, a plurality of printed conductive traces formed from a second printed conductive layer provides for electrical connectivity between the various components that are coupled to the back side 1208, 1248 of the PCB 1204, 1244.

Figure 12A:
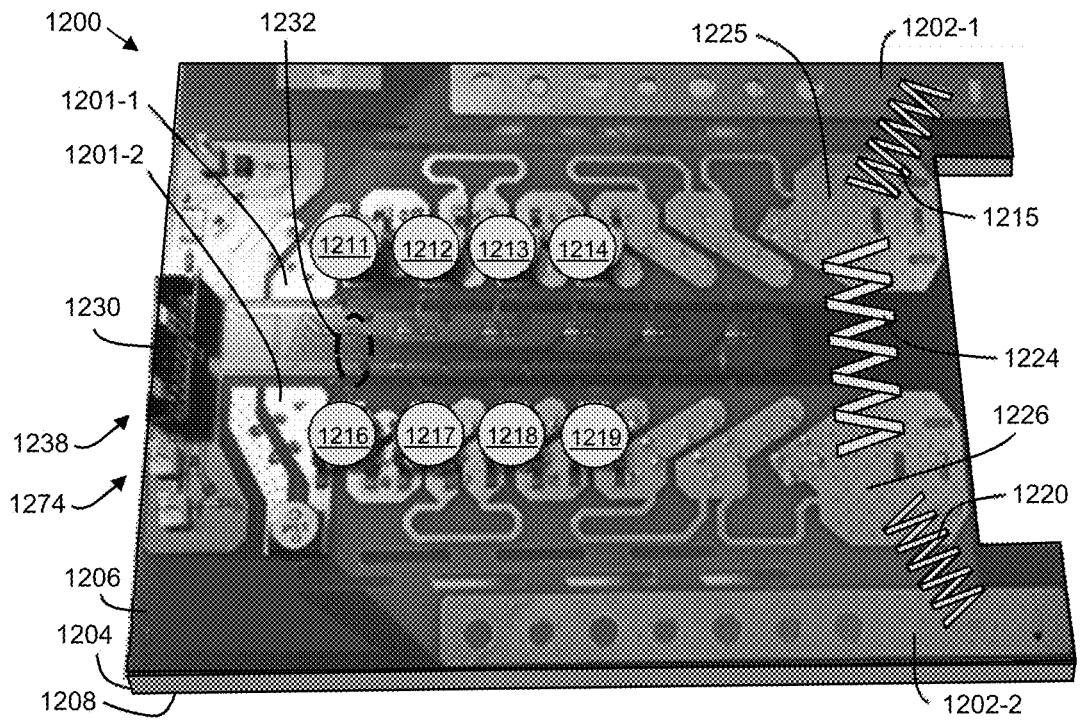
FIG. 12A is a perspective view of a double-ended variable impedance matching network module with variable inductances, in accordance with an example embodiment.
Figure 12B:
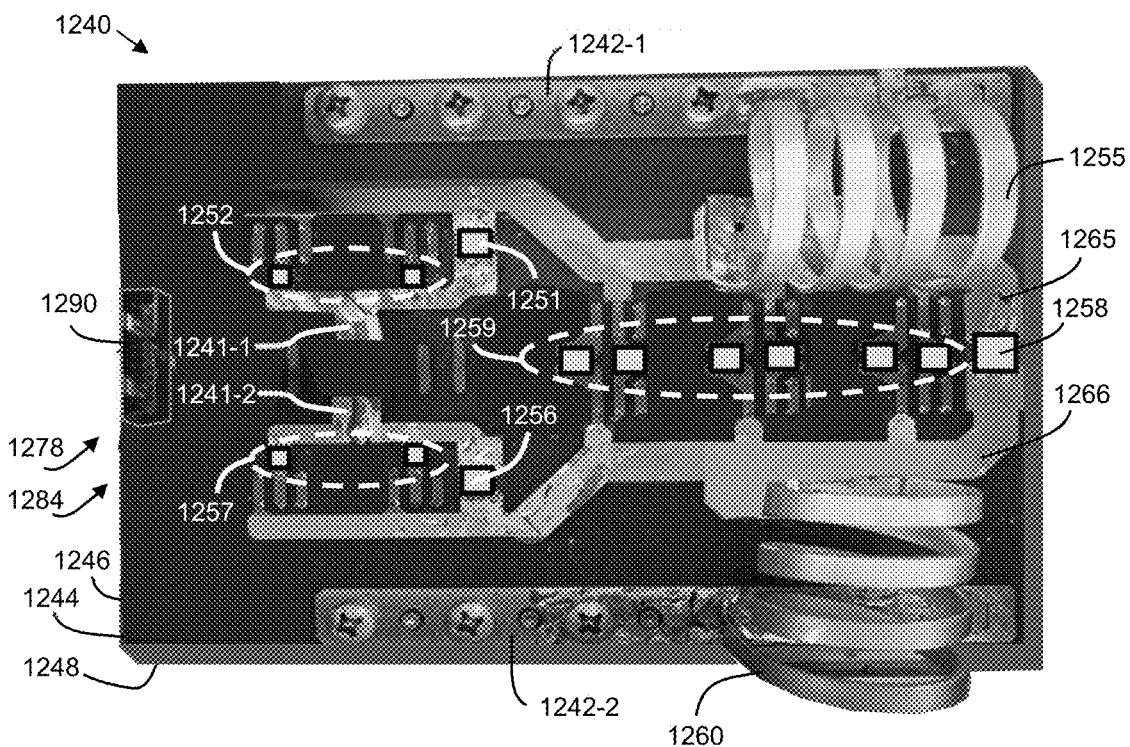
FIG. 12B is a perspective view of a double-ended variable impedance matching network module with variable capacitances, in accordance with another example embodiment.

According to an embodiment, each PCB 1204, 1244 houses an RF input connector 1238, 1278 (e.g., coupled to back side 1208, 1248 and thus not visible in the views of FIGS. 12A, 12B, but corresponding to connector 738, FIG. 7) and a balun 1274, 1284 (e.g., coupled to back side 1208, 1248 and thus not visible in the view of FIGS. 12A, 12B, but corresponding to balun 774, FIG. 7). The input connector 1238, 1278 is configured to be electrically connected to an RF subsystem (e.g., subsystem 310, 710, FIGS. 3, 7) with a connection (e.g., connection 728-3, FIG. 7) such as a coaxial cable or other type of conductor. In such an embodiment, an unbalanced RF signal received by the balun 1274, 1284 from the RF input connector 1238, 1278 is converted to a balanced signal, which is provided over a pair of balanced conductors (e.g., connections 728-4, FIG. 7) to a double-ended input that includes first and second inputs 1201-1, 1201-2 or 1241-1, 1242-2. The connection between the input connector 1238, 1278 and the balun 1274, 1284, and the connections between the balun 1274, 1284 and the inputs 1201-1, 1201-2, 1241-1, 1241-2 each may be implemented using conductive traces and vias formed on and in the PCB 1204, 1244. In an alternate embodiment, as discussed above, an alternate embodiment may include a balanced amplifier (e.g., balanced amplifier 724', FIG. 7), which produces a balanced signal on connections (e.g., conductors 728-1', FIG. 7) that can be directly coupled to the inputs 1201-1, 1201-2, 1241-1, 1241-2. In such an embodiment, the balun 1274, 1284 may be excluded from the module 1200, 1240.

In addition, each PCB 1204, 1244 houses circuitry associated with a double-ended variable impedance matching network (e.g., network 772, 800, 900, 1000, FIGS. 7-10). Referring first to FIG. 12A, which corresponds to a module 1200 that houses a variable inductance impedance matching network (e.g., networks 800, 900, FIGS. 8, 9), the circuitry housed by the PCB 1204 includes the double-ended input 1201-1, 1201-2 (e.g., inputs 901-1, 901-2, FIG. 9), a double-ended output 1202-1, 1202-2 (e.g., outputs 902-1, 902-2, FIG. 9), a first plurality of inductors 1211, 1212, 1213, 1214, 1215 (e.g., inductors 911-915, FIG. 9) coupled in series between a first input 1201-1 of the double-ended input and a first output 1202-1 of the double-ended output, a second plurality of inductors 1216, 1217, 1218, 1219, 1220 (e.g., inductors 916-920, FIG. 9) coupled in series between a second input 1201-2 of the double-ended input and a second output 1202-2 of the double-ended output, a third plurality of inductors (not visible in the view of FIG. 12, but corresponding to inductors 921-923, FIG. 9, for example) coupled in series between the first and second inputs 1201-1, 1201-2, and one or more additional inductors 1224 (e.g., inductor 924, FIG. 9) coupled between nodes 1225 and 1226 (e.g., nodes 925, 926).

A plurality of switches or relays (e.g., not visible in the view of FIG. 12, but corresponding to switches 931-934, 936-939, 941, 943, FIG. 9, for example) also are coupled to the PCB 1204. For example, the plurality of switches or relays may be coupled to the front side 1206 or to the back side 1208 of the PCB 1204. Each of the switches or relays is electrically connected in parallel across one of the inductors 1211-1214, 1216-1219, or one of the inductors (e.g., inductors 921, 923, FIG. 9) between inputs 1202-1 and 1202-2, in an embodiment. A control connector 1230 is coupled to the PCB 1204, and conductors of the control connector 1230 are electrically coupled to conductive traces 1232 to provide control signals to the switches (e.g., control signals 951-954, 956-959, 961, 963, FIG. 9), and thus to switch the inductors into or out of the circuit, as described previously. As shown in FIG. 12A, fixed-value inductors 1215, 1220 (e.g., inductors 915, 920, FIG. 9) may be formed from relatively large coils, although they may be implemented using other structures as well. Further, as shown in the embodiment of FIG. 12A, the conductive features corresponding to outputs 1202-1, 1202-2 may be relatively large, and may be elongated for direct attachment to the electrodes (e.g., electrodes 740, 750, FIG. 7) of the system.

Referring now to FIG. 12B, which corresponds to a module 1240 that houses a variable capacitance impedance matching network (e.g., network 1000, FIG. 10), the circuitry housed by the PCB 1244 includes a double-ended input 1241-1, 1241-2 (e.g., inputs 1001-1, 1001-2, FIG. 10), a double-ended output 1242-1, 1242-2 (e.g., outputs 1002-1, 1002-2, FIG. 10), a first plurality of capacitors 1251, 1252 (e.g., capacitors 1012, 1013, FIG. 10) that comprise a first variable capacitance network (e.g., network 1011, FIG. 10) coupled between a first input 1241-1 of the double-ended input and a first intermediate node 1265 (e.g., node 1025, FIG. 10), a second plurality of capacitors 1256, 1257 (e.g., capacitors 1017, 1018, FIG. 10) that comprise a second variable capacitance network (e.g., network 1016, FIG. 10) coupled between a second input 1241-2 of the double-ended input and a second intermediate node 1266 (e.g., node 1026, FIG. 10), a third plurality of capacitors 1258, 1259 (e.g., capacitors 1023, 1024, FIG. 10) coupled between nodes 1265, 1266 (e.g., nodes 1025, 1026), and one or more additional inductors 1255, 1260 (e.g., inductors 1015, 1020, FIG. 10) coupled between nodes 1265 and 1266 and outputs 1242-1, 1242-2.

The first, second, and third pluralities of capacitors each include a fixed capacitor 1251, 1256, 1258 (e.g., capacitors 1012, 1017, 1023, FIG. 10), and a set of one or more capacitors 1252, 1257, 1259 that make up a variable capacitor (e.g., variable capacitors 1013, 1018, 1024). Each set of variable capacitors 1252, 1257, 1259 may be implemented using a capacitive network, such as network 500, FIG. 5. A plurality of switches or relays (e.g., not visible in the view of FIG. 12B, but corresponding to switches 551-554, FIG. 5, for example) also are coupled to the PCB 1244. For example, the plurality of switches or relays may be coupled to the front side 1246 or to the back side 1248 of the PCB 1244. Each of the switches or relays is electrically connected in series with a terminal of a different one of the capacitors associated with the variable capacitors 1252, 1257, 1259. A control connector 1290 is coupled to the PCB 1244, and conductors of the control connector (not shown in FIG. 12B) are electrically coupled to conductive traces within PCB 1244 to provide control signals to the switches (e.g., control signals 561-564, FIG. 5), and thus to switch the capacitors into or out of the circuit, as described previously.

As shown in FIG. 12B, fixed-value inductors 1255, 1260 (e.g., inductors 1015, 1020, FIG. 10) are electrically coupled between intermediate nodes 1265 and 1266 and outputs 1242-1, 1242-2. The inductors 1255, 1260 may be formed from relatively large coils, although they may be implemented using other structures as well. Further, as shown in the embodiment of FIG. 12B, the conductive features corresponding to outputs 1242-1, 1242-2 may be relatively large, and may be elongated for direct attachment to the electrodes (e.g., electrodes 740, 750, FIG. 7) of the system. According to an embodiment, and as illustrated in FIG. 12B, the inductors 1255, 1260 are arranged so that their primary axes are perpendicular to each other (i.e., the axes extending through the centers of the inductors 1255, 1260 are at about 90 degree angles). This may result in significantly reduced electromagnetic coupling between the inductors 1255, 1260. In other embodiments, the inductors 1255, 1260 may be arranged so that their primary axes are parallel, or may be arranged with other angular offsets.

Figure 13:
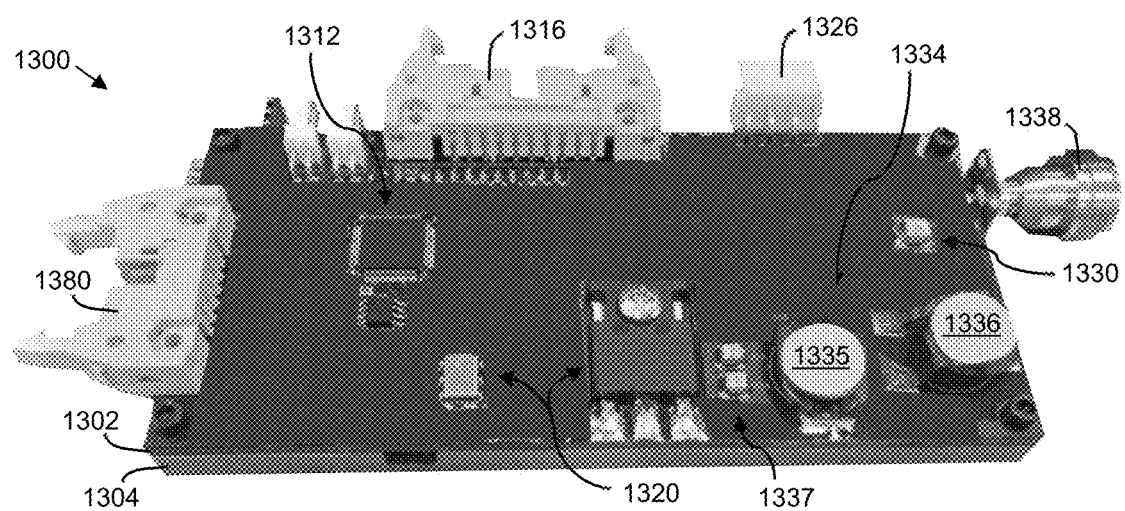
FIG. 13 is a perspective view of an RF module, in accordance with an example embodiment.

In various embodiments, the circuitry associated with the RF subsystem (e.g., RF subsystem 310, 710, FIGS. 3, 7) also may be implemented in the form of one or more modules. For example, FIG. 13 is a perspective view of an RF module 1300 that includes an RF subsystem (e.g., RF subsystem 310, 710, FIGS. 3, 7), in accordance with an example embodiment. The RF module 1300 includes a PCB 1302 coupled to a ground substrate 1304. The ground substrate 1304 provides structural support for the PCB 1302, and also provides an electrical ground reference and heat sink functionality for the various electrical components coupled to the PCB 1302.

According to an embodiment, the PCB 1302 houses the circuitry associated with the RF subsystem (e.g., subsystem 310 or 710, FIGS. 3, 7). Accordingly, the circuitry housed by the PCB 1302 includes system controller circuitry 1312 (e.g., corresponding to system controller 312, 712, FIGS. 3, 7), RF signal source circuitry 1320 (e.g., corresponding to RF signal source 320, 720, FIGS. 3, 7, including an RF signal generator 322, 722 and power amplifier 324, 325, 724), power detection circuitry 1330 (e.g., corresponding to power detection circuitry 330, 730, FIGS. 3, 7), and impedance matching circuitry 1334 (e.g., corresponding to first matching circuitry 334, 734, FIGS. 3, 7).

In the embodiment of FIG. 13, the system controller circuitry 1312 includes a processor IC and a memory IC, the RF signal source circuitry 1320 includes a signal generator IC and one or more power amplifier devices, the power detection circuitry 1330 includes a power coupler device, and the impedance matching circuitry 1334 includes a plurality of passive components (e.g., inductors 1335, 1336 and capacitors 1337) connected together to form an impedance matching network. The circuitry 1312, 1320, 1330, 1334 and the various sub-components may be electrically coupled together through conductive traces on the PCB 1302 as discussed previously in reference to the various conductors and connections discussed in conjunction with FIGS. 3, 7.

RF module 1300 also includes a plurality of connectors 1316, 1326, 1338, 1380, in an embodiment. For example, connector 1380 may be configured to connect with a host system that includes a user interface (e.g., user interface 380, 780, FIGS. 3, 7) and other functionality. Connector 1316 may be configured to connect with a variable matching circuit (e.g., circuit 372, 772, FIGS. 3, 7) to provide control signals to the circuit, as previously described. Connector 1326 may be configured to connect to a power supply to receive system power. Finally, connector 1338 (e.g., connector 336, 736, FIGS. 3, 7) may be configured to connect to a coaxial cable or other transmission line, which enables the RF module 1300 to be electrically connected (e.g., through a coaxial cable implementation of conductor 328-2, 728-3, FIGS. 3, 7) to a variable matching subsystem (e.g., subsystem 370, 770, FIGS. 3, 7). In an alternate embodiment, components of the variable matching subsystem (e.g., variable matching network 370, balun 774, and/or variable matching circuit 772, FIGS. 3, 7) also may be integrated onto the PCB 1302, in which case connector 1336 may be excluded from the module 1300. Other variations in the layout, subsystems, and components of RF module 1300 may be made, as well.

Embodiments of an RF module (e.g., module 1300, FIG. 13) and a variable impedance matching network module (e.g., module 1200, 1240, FIGS. 12A, 12B) may be electrically connected together, and connected with other components, to form a defrosting apparatus or system (e.g., apparatus 100, 200, 300, 700, 1100, FIGS. 1-3, 7, 11). For example, an RF signal connection may be made through a connection (e.g., conductor 728-3, FIG. 7), such as a coaxial cable, between the RF connector 1338 (FIG. 13) and the RF connector 1238 (FIG. 12A) or RF connector 1278 (FIG. 12B), and control connections may be made through connections (e.g., conductors 716, FIG. 7), such as a multi-conductor cable, between the connector 1316 (FIG. 13) and the connector 1230 (FIG. 12A) or connector 1290 (FIG. 12B). To further assemble the system, a host system or user interface may be connected to the RF module 1300 through connector 1380, a power supply may be connected to the RF module 1300 through connector 1326, and electrodes (e.g., electrodes 740, 750, FIG. 7) may be connected to the outputs 1202-1, 1202-2 (FIG. 12A) or 1242-1, 1242-2 (FIG. 12B). Of course, the above-described assembly also would be physically connected to various support structures and other system components so that the electrodes are held in a fixed relationship to each other across a defrosting cavity (e.g., cavity 110, 360, 760, FIGS. 1, 3, 7), and the defrosting apparatus may be integrated within a larger system (e.g., systems 100, 200, FIGS. 1, 2).

Figure 14:
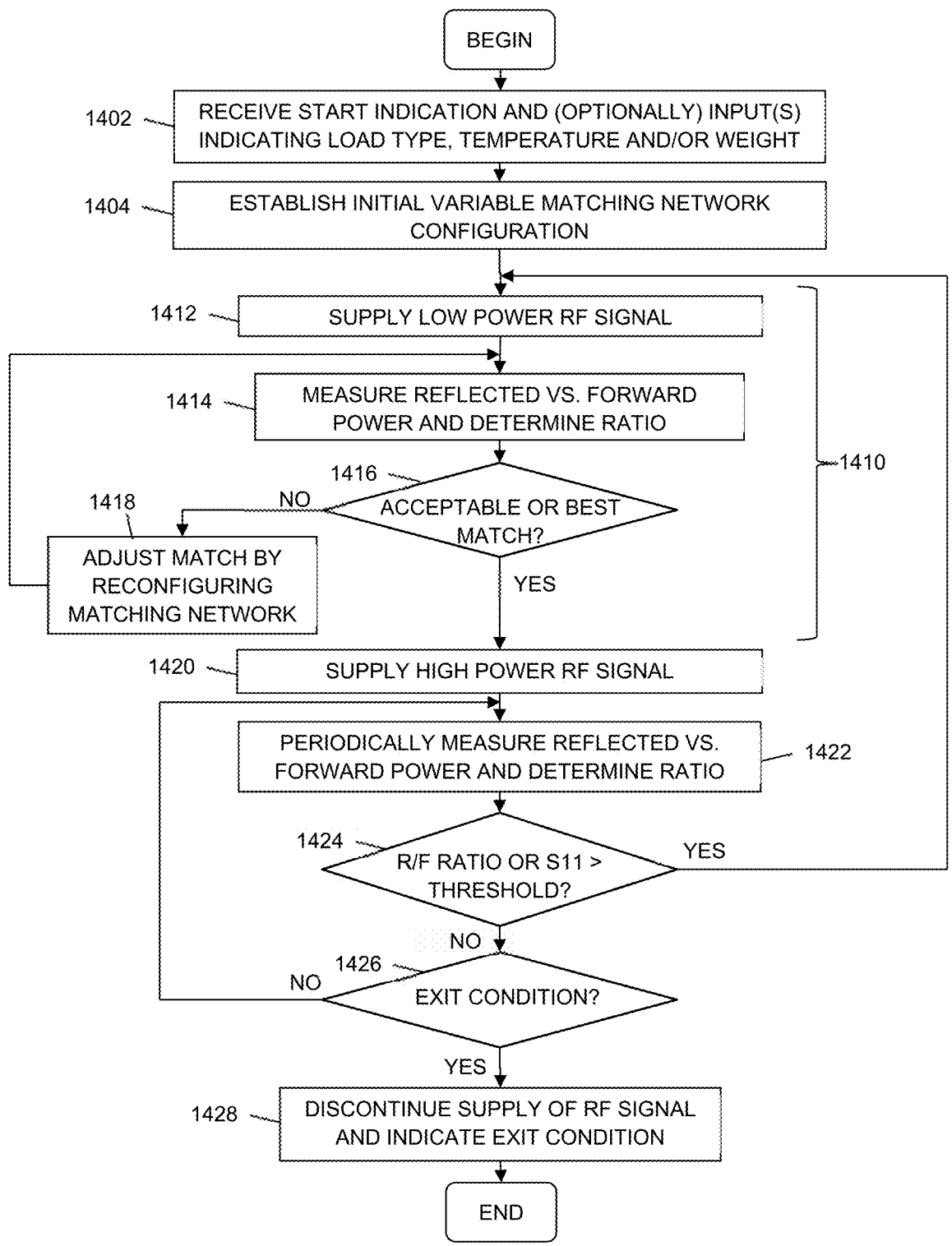
FIG. 14 is a flowchart of a method of operating a defrosting system with dynamic load matching, in accordance with an example embodiment.

Now that embodiments of the electrical and physical aspects of defrosting systems have been described, various embodiments of methods for operating such defrosting systems will now be described in conjunction with FIGS. 14 and 15. More specifically, FIG. 14 is a flowchart of a method of operating a defrosting system (e.g., system 100, 210, 220, 300, 700, 1100, FIGS. 1-3, 7, 11) with dynamic load matching, in accordance with an example embodiment.

The method may begin, in block 1402, when the system controller (e.g., system controller 312, 712, 1130, FIGS. 3, 7, 11) receives an indication that a defrosting operation should start. Such an indication may be received, for example, after a user has place a load (e.g., load 364, 764, 1164, FIGS. 3, 7, 11) into the system's defrosting cavity (e.g., cavity 360, 760, 1174, FIGS. 3, 7, 11), has sealed the cavity (e.g., by closing a door or drawer), and has pressed a start button (e.g., of the user interface 380, 780, FIGS. 3, 7). In an embodiment, sealing of the cavity may engage one or more safety interlock mechanisms, which when engaged, indicate that RF power supplied to the cavity will not substantially leak into the environment outside of the cavity. As will be described later, disengagement of a safety interlock mechanism may cause the system controller immediately to pause or terminate the defrosting operation.

According to various embodiments, the system controller optionally may receive additional inputs indicating the load type (e.g., meats, liquids, or other materials), the initial load temperature, and/or the load weight. For example, information regarding the load type may be received from the user through interaction with the user interface (e.g., by the user selecting from a list of recognized load types). Alternatively, the system may be configured to scan a barcode visible on the exterior of the load, or to receive an electronic signal from an RFID device on or embedded within the load. Information regarding the initial load temperature may be received, for example, from one or more temperature sensors and/or IR sensors (e.g., sensors 390, 792, 790, 1192, FIGS. 3, 7, 11) of the system. Information regarding the load weight may be received from the user through interaction with the user interface, or from a weight sensor (e.g., sensor 390, 790, 790, 1190, FIGS. 3, 7, 11) of the system. As indicated above, receipt of inputs indicating the load type, initial load temperature, and/or load weight is optional, and the system alternatively may not receive some or all of these inputs.

In block 1404, the system controller provides control signals to the variable matching network (e.g., network 370, 400, 440, 772, 800, 900, 1000, 1160, FIGS. 3, 4A, 4B, 7-11) to establish an initial configuration or state for the variable matching network. As described in detail in conjunction with FIGS. 4A, 4B, 5A, 5B, and 8-10, the control signals affect the values of various inductances and/or capacitances (e.g., inductances 410, 411, 414, 811, 816, 821, FIGS. 4A, 8, and capacitances 444, 448, 1013, 1018, 1024, FIGS. 4B, 10) within the variable matching network. For example, the control signals may affect the states of bypass switches (e.g., switches 511-514, 551-554, 931-934, 936-939, 941, 943, FIGS. 5A, 5B, 9), which are responsive to the control signals from the system controller (e.g., control signals 521-524, 561-564, 951-954, 956-959, 961, 963, FIGS. 5A, 5B, 9).

As also discussed previously, a first portion of the variable matching network may be configured to provide a match for the RF signal source (e.g., RF signal source 320, 720, 1120, FIGS. 3, 7, 11) or the final stage power amplifier (e.g., power amplifier 325, 724, FIGS. 3, 7), and a second portion of the variable matching network may be configured to provide a match for the cavity (e.g., cavity 360, 760, 1160, FIGS. 3, 7, 11) plus the load (e.g., load 364, 764, 1164, FIGS. 3, 7, 11). For example, referring to FIG. 4A, a first shunt, variable inductance network 410 may be configured to provide the RF signal source match, and a second shunt, variable inductance network 416 may be configured to provide the cavity plus load match. Referring to FIG. 4B, a first variable capacitance network 442, in conjunction with a second variable capacitance network 446, may be both configured to provide an optimum match between the RF signal source and the cavity plus load.

It has been observed that a best initial overall match for a frozen load (i.e., a match at which a maximum amount of RF power is absorbed by the load) typically has a relatively high inductance for the cavity matching portion of the matching network, and a relatively low inductance for the RF signal source matching portion of the matching network. For example, FIG. 15 is a chart plotting optimal cavity match setting versus RF signal source match setting through a defrost operation for two different loads, where trace 1510 corresponds to a first load (e.g., having a first type, weight, and so on), and trace 1520 corresponds to a second load (e.g., having a second type, weight, and so on). In FIG. 15, the optimal initial match settings for the two loads at the beginning of a defrost operation (e.g., when the loads are frozen) are indicated by points 1512 and 1522, respectively. As can be seen, both points 1512 and 1522 indicate relatively high cavity match settings in comparison to relatively low RF source match settings. Referring to the embodiment of FIG. 4A, this translates to a relatively high inductance for variable inductance network 416, and a relatively low inductance for variable inductance network 410. Referring to the embodiment of FIG. 8, this translates to a relatively high inductance for variable inductance networks 811 and 816, and a relatively low inductance for variable inductance network 821.

According to an embodiment, to establish the initial configuration or state for the variable matching network in block 1404, the system controller sends control signals to the first and second variable inductance networks (e.g., networks 410, 411, FIG. 4A) to cause the variable inductance network for the RF signal source match (e.g., network 410) to have a relatively low inductance, and to cause the variable inductance network for the cavity match (e.g., network 411) to have a relatively high inductance. The system controller may determine how low or how high the inductances are set based on load type/weight/temperature information known to the system controller a priori. If no a priori load type/weight/temperature information is available to the system controller, the system controller may select a relatively low default inductance for the RF signal source match and a relatively high default inductance for the cavity match.

Assuming, however, that the system controller does have a priori information regarding the load characteristics, the system controller may attempt to establish an initial configuration near the optimal initial matching point. For example, and referring again to FIG. 15, the optimal initial matching point 1512 for the first type of load has a cavity match (e.g., implemented by network 411, FIG. 4A or 811/816, FIG. 8) of about 80 percent of the network's maximum value, and has an RF signal source match (e.g., implemented by network 410 or 821, FIGS. 4A, 8) of about 10 percent of the network's maximum value. Assuming each of the variable inductance networks has a structure similar to the network 500 of FIG. 5, for example, and assuming that the states from Table 1, above, apply, then for the first type of load, system controller may initialize the variable inductance network so that the cavity match network (e.g., network 411 or 811/816) has state 12 (i.e., about 80 percent of the maximum possible inductance of network 411 or 811/816), and the RF signal source match network (e.g., network 410 or 821) has state 2 (i.e., about 10 percent of the maximum possible inductance of network 410). Conversely, the optimal initial matching point 1522 for the second type of load has a cavity match (e.g., implemented by network 411 or 811/816) of about 40 percent of the network's maximum value, and has an RF signal source match (e.g., implemented by network 410 or 821) of about 10 percent of the network's maximum value. Accordingly, for the second type of load, system controller may initialize the variable inductance network so that the cavity match network (e.g., network 411 or 811/816) has state 6 (i.e., about 40 percent of the maximum possible inductance of network 411 or 811/816), and the RF signal source match network (e.g., network 410 or 821) has state 2 (i.e., about 10 percent of the maximum possible inductance of network 410 or 821). Generally, during a defrosting operation, adjustments to the impedance values of the RF signal source match network and the cavity match network are made in an inverse manner. In other words, when the impedance value of the RF signal source match network is decreased, the impedance value of the cavity match network is increased, and vice versa. Although not described in detail herein, a similar adjustment process may be performed to control the matching provided by a variable capacitance network embodiment (e.g., networks 440, FIG. 4B and 1000, FIG. 10).

Referring again to FIG. 14, once the initial variable matching network configuration is established, the system controller may perform a process 1410 of adjusting, if necessary, the configuration of the variable impedance matching network to find an acceptable or best match based on actual measurements that are indicative of the quality of the match. According to an embodiment, this process includes causing the RF signal source (e.g., RF signal source 320, 720, 1120, FIGS. 3, 7, 11) to supply a relatively low power RF signal through the variable impedance matching network to the electrode(s) (e.g., first electrode 340 or both electrodes 740, 750, 1170, 1172, FIGS. 3, 7, 11), in block 1412. The system controller may control the RF signal power level through control signals to the power supply and bias circuitry (e.g., circuitry 326, 726, FIGS. 3, 7), where the control signals cause the power supply and bias circuitry to provide supply and bias voltages to the amplifiers (e.g., amplifier stages 324, 325, 724, FIGS. 3, 7) that are consistent with the desired signal power level. For example, the relatively low power RF signal may be a signal having a power level in a range of about 10 W to about 20 W, although different power levels alternatively may be used. A relatively low power level signal during the match adjustment process 1410 is desirable to reduce the risk of damaging the cavity or load (e.g., if the initial match causes high reflected power), and to reduce the risk of damaging the switching components of the variable inductance networks (e.g., due to arcing across the switch contacts).

In block 1414, power detection circuitry (e.g., power detection circuitry 330, 730, 730', 730", 1180, FIGS. 3, 7, 11) then measures the reflected and (in some embodiments) forward power along the transmission path (e.g., path 328, 728, 1148, FIGS. 3, 7, 11) between the RF signal source and the electrode(s), and provides those measurements to the system controller. The system controller may then determine a ratio between the reflected and forward signal powers, and may determine the S11 parameter for the system based on the ratio. The system controller may store the received power measurements (e.g., the received reflected power measurements, the received forward power measurement, or both), and/or the calculated ratios, and/or S11 parameters for future evaluation or comparison, in an embodiment.

In block 1416, the system controller may determine, based on the reflected power measurements, and/or the reflected-to-forward signal power ratio, and/or the S11 parameter, whether or not the match provided by the variable impedance matching network is acceptable (e.g., the reflected power is below a threshold, or the ratio is 10 percent or less, or the measurements or values compare favorably with some other criteria). Alternatively, the system controller may be configured to determine whether the match is the "best" match. A "best" match may be determined, for example, by iteratively measuring the reflected RF power (and in some embodiments the forward reflected RF power) for all possible impedance matching network configurations (or at least for a defined subset of impedance matching network configurations), and determining which configuration results in the lowest reflected RF power and/or the lowest reflected-to-forward power ratio.

When the system controller determines that the match is not acceptable or is not the best match, the system controller may adjust the match, in block 1418, by reconfiguring the variable impedance matching network. For example, this may be achieved by sending control signals to the variable impedance matching network, which cause the network to increase and/or decrease the variable inductances within the network (e.g., by causing the variable inductance networks 410, 411, 811, 816, 821 (FIGS. 4A, 8) or variable capacitance networks 442, 446, 1011, 1016, 1021 (FIGS. 4B, 10) to have different inductance or capacitance states, or by switching inductors 501-504, 911-914, 916-919, 921, 923 (FIGS. 5A, 9) or capacitors 541-544 (FIG. 5B) into or out of the circuit). After reconfiguring the variable inductance network, blocks 1414, 1416, and 1418 may be iteratively performed until an acceptable or best match is determined in block 1416.

Once an acceptable or best match is determined, the defrosting operation may commence. Commencement of the defrosting operation includes increasing the power of the RF signal supplied by the RF signal source (e.g., RF signal source 320, 720, 1120, FIGS. 3, 7, 11) to a relatively high power RF signal, in block 1420. Once again, the system controller may control the RF signal power level through control signals to the power supply and bias circuitry (e.g., circuitry 326, 726, FIGS. 3, 7), where the control signals cause the power supply and bias circuitry to provide supply and bias voltages to the amplifiers (e.g., amplifier stages 324, 325, 724, FIGS. 3, 7) that are consistent with the desired signal power level. For example, the relatively high power RF signal may be a signal having a power level in a range of about 50 W to about 500 W, although different power levels alternatively may be used.

In block 1422, power detection circuitry (e.g., power detection circuitry 330, 730, 730', 730", 1180, FIGS. 3, 7, 11) then periodically measures the reflected power and, in some embodiments, the forward power along the transmission path (e.g., path 328, 728, 1148, FIGS. 3, 7, 11) between the RF signal source and the electrode(s), and provides those measurements to the system controller. The system controller again may determine a ratio between the reflected and forward signal powers, and may determine the S11 parameter for the system based on the ratio. The system controller may store the received power measurements, and/or the calculated ratios, and/or S11 parameters for future evaluation or comparison, in an embodiment. According to an embodiment, the periodic measurements of the forward and reflected power may be taken at a fairly high frequency (e.g., on the order of milliseconds) or at a fairly low frequency (e.g., on the order of seconds). For example, a fairly low frequency for taking the periodic measurements may be a rate of one measurement every 10 seconds to 20 seconds.

In block 1424, the system controller may determine, based on one or more reflected signal power measurements, one or more calculated reflected-to-forward signal power ratios, and/or one or more calculated S11 parameters, whether or not the match provided by the variable impedance matching network is acceptable. For example, the system controller may use a single reflected signal power measurement, a single calculated reflected-to-forward signal power ratio, or a single calculated S11 parameter in making this determination, or may take an average (or other calculation) of a number of previously-received reflected signal power measurements, previously-calculated reflected-to-forward power ratios, or previously-calculated S11 parameters in making this determination. To determine whether or not the match is acceptable, the system controller may compare the received reflected signal power, the calculated ratio, and/or S11 parameter to one or more corresponding thresholds, for example. For example, in one embodiment, the system controller may compare the received reflected signal power to a threshold of, for example, 5 percent (or some other value) of the forward signal power. A reflected signal power below 5 percent of the forward signal power may indicate that the match remains acceptable, and a ratio above 5 percent may indicate that the match is no longer acceptable. In another embodiment, the system controller may compare the calculated reflected-to-forward signal power ratio to a threshold of 10 percent (or some other value). A ratio below 10 percent may indicate that the match remains acceptable, and a ratio above 10 percent may indicate that the match is no longer acceptable. When the measured reflected power, or the calculated ratio or S11 parameter is greater than the corresponding threshold (i.e., the comparison is unfavorable), indicating an unacceptable match, then the system controller may initiate re-configuration of the variable impedance matching network by again performing process 1410.

As discussed previously, the match provided by the variable impedance matching network may degrade over the course of a defrosting operation due to impedance changes of the load (e.g., load 364, 764, 1164, FIGS. 3, 7, 11) as the load warms up. It has been observed that, over the course of a defrosting operation, an optimal cavity match may be maintained by adjusting the cavity match inductance or capacitance and by also adjusting the RF signal source inductance or capacitance. Referring again to FIG. 15, for example, an optimal match for the first type of load at the end of a defrosting operation is indicated by point 1514, and an optimal match for the second type of load at the end of a defrosting operation is indicated by point 1524. In both cases, for example, tracking of the optimal match between initiation and completion of the defrosting operations involves gradually decreasing the inductance of the cavity match and increasing the inductance of the RF signal source match.

According to an embodiment, in the iterative process 1410 of re-configuring the variable impedance matching network, the system controller may take into consideration this tendency. More particularly, when adjusting the match by reconfiguring the variable impedance matching network in block 1418, the system controller initially may select states of the variable inductance networks for the cavity and RF signal source matches that correspond to lower inductances (for the cavity match, or network 411, FIG. 4A) and higher inductances (for the RF signal source match, or network 410, FIG. 4B). Similar processes may be performed in embodiments that utilize variable capacitance networks for the cavity and RF signal source. By selecting impedances that tend to follow the expected optimal match trajectories (e.g., those illustrated in FIG. 15), the time to perform the variable impedance matching network reconfiguration process 1410 may be reduced, when compared with a reconfiguration process that does not take these tendencies into account.

In an alternate embodiment, the system controller may instead iteratively test each adjacent configuration to attempt to determine an acceptable configuration. For example, referring again to Table 1, above, if the current configuration corresponds to state 12 for the cavity matching network and to state 3 for the RF signal source matching network, the system controller may test states 11 and/or 13 for the cavity matching network, and may test states 2 and/or 4 for the RF signal source matching network. If those tests do not yield a favorable result (i.e., an acceptable match), the system controller may test states 10 and/or 14 for the cavity matching network, and may test states 1 and/or 5 for the RF signal source matching network, and so on.

In actuality, there are a variety of different searching methods that the system controller may employ to re-configure the system to have an acceptable impedance match, including testing all possible variable impedance matching network configurations. Any reasonable method of searching for an acceptable configuration is considered to fall within the scope of the inventive subject matter. In any event, once an acceptable match is determined in block 1416, the defrosting operation is resumed in block 1414, and the process continues to iterate.

Referring back to block 1424, when the system controller determines, based on one or more reflected power measurements, one or more calculated reflected-to-forward signal power ratios, and/or one or more calculated S11 parameters, that the match provided by the variable impedance matching network is still acceptable (e.g., the reflected power measurements, calculated ratio, or S11 parameter is less than a corresponding threshold, or the comparison is favorable), the system may evaluate whether or not an exit condition has occurred, in block 1426. In actuality, determination of whether an exit condition has occurred may be an interrupt driven process that may occur at any point during the defrosting process. However, for the purposes of including it in the flowchart of FIG. 14, the process is shown to occur after block 1424.

In any event, several conditions may warrant cessation of the defrosting operation. For example, the system may determine that an exit condition has occurred when a safety interlock is breached. Alternatively, the system may determine that an exit condition has occurred upon expiration of a timer that was set by the user (e.g., through user interface 380, 780, FIGS. 3, 7) or upon expiration of a timer that was established by the system controller based on the system controller's estimate of how long the defrosting operation should be performed. In still another alternate embodiment, the system may otherwise detect completion of the defrosting operation.

If an exit condition has not occurred, then the defrosting operation may continue by iteratively performing blocks 1422 and 1424 (and the matching network reconfiguration process 1410, as necessary). When an exit condition has occurred, then in block 1428, the system controller causes the supply of the RF signal by the RF signal source to be discontinued. For example, the system controller may disable the RF signal generator (e.g., RF signal generator 322, 722, FIGS. 3, 7) and/or may cause the power supply and bias circuitry (e.g., circuitry 326, 726, FIGS. 3, 7) to discontinue provision of the supply current. In addition, the system controller may send signals to the user interface (e.g., user interface 380, 780, FIGS. 3, 7) that cause the user interface to produce a user-perceptible indicia of the exit condition (e.g., by displaying "door open" or "done" on a display device, or providing an audible tone). The method may then end.

It should be understood that the order of operations associated with the blocks depicted in FIG. 14 corresponds to an example embodiment, and should not be construed to limit the sequence of operations only to the illustrated order. Instead, some operations may be performed in different orders, and/or some operations may be performed in parallel.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with) another element, and not necessarily mechanically. Thus, although the schematic shown in the figures depict one exemplary arrangement of elements, additional intervening elements, devices, features, or components may be present in an embodiment of the depicted subject matter.

An embodiment of an impedance matching network includes first and second input nodes, first and second output nodes, a first variable capacitor and a first inductor coupled in series between the first input node and the first output node, with a first intermediate node between the first variable capacitor and the first inductor, a second variable capacitor and a second inductor coupled in series between the second input node and the second output node, with a second intermediate node between the second variable capacitor and the second inductor, and a third variable capacitor coupled between the first and second intermediate nodes.

An embodiment of a thermal increase system coupled to a cavity for containing a load includes a radio frequency (RF) signal source, a transmission path, an impedance matching network, power detection circuitry, and a controller. The RF signal source is configured to supply an RF signal. The transmission path is electrically coupled between the RF signal source and first and second electrodes that are positioned across the cavity. The impedance matching network is electrically coupled along the transmission path. The impedance matching network includes first and second input nodes, first and second output nodes, a first variable capacitor coupled between the first input node and the first output node, and a second variable capacitor coupled between the second input node and the second output node. The power detection circuitry is configured to detect reflected signal power along the transmission path. The controller is configured to modify, based on the reflected signal power, capacitance values of the first and second variable capacitors of the impedance matching network to reduce the reflected signal power and to maximize the forward signal power.

An embodiment of a method of operating a thermal increase system that includes a cavity includes supplying, by an RF signal source, one or more RF signals to a transmission path that is electrically coupled between the RF signal source and first and second that are positioned across the cavity. The transmission path includes a double-ended variable impedance matching network that includes first and second inputs, first and second outputs, a first variable capacitor connected between the first input and the first output, and a second variable capacitor connected between the second input and the second output. The method further includes detecting, by power detection circuitry, reflected signal power along the transmission path, and modifying, by a controller, capacitance values of the first and second variable capacitors of the impedance matching network to reduce the reflected signal power.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A thermal increase system coupled to a cavity for containing a load, the thermal increase system comprising:
    a radio frequency, RF, signal source configured to supply an RF signal;
    a transmission path electrically coupled between the RF signal source and first and second electrodes that are positioned across the cavity;
    an impedance matching network electrically coupled along the transmission path, wherein the impedance matching network includes
        first and second input nodes,
        first and second output nodes,
        a first variable capacitor coupled between the first input node and the first output node,
        a second variable capacitor coupled between the second input node and the second output node,
        a first inductor coupled in series with the first variable capacitor between the first input node and the first output node, wherein a first intermediate node is interposed between the first inductor and the first variable capacitor,
        a second inductor coupled in series with the second variable capacitor between the second input node and the second output node, wherein a second intermediate node is interposed between the second inductor and the second variable capacitor,
        a third variable capacitor coupled between the first intermediate node and the second intermediate node,
        a first fixed capacitor coupled in parallel with the first variable capacitor;
        a second fixed capacitor coupled in parallel with the second variable capacitor; and
        a third fixed capacitor coupled in parallel with the third variable capacitor;
    power detection circuitry configured to detect reflected signal power along the transmission path; and
    a controller configured to modify, based on the reflected signal power, capacitance values of the first and second variable capacitors of the impedance matching network to reduce the reflected signal power.

2. The thermal increase system of claim 1, wherein at least some of the plurality of first, second, and third capacitors have different capacitance values.

3. The thermal increase system of claim 1, wherein:
    the power detection circuitry is further configured to detect forward signal power along the transmission path; and
    the controller is configured to modify the capacitance values of the first and second variable capacitors of the impedance matching network to reduce the reflected signal power and maximize the forward signal power.

4. The thermal increase system of claim 1, wherein the RF signal source is configured to produce an unbalanced RF signal, and the system further comprises:
    a conversion apparatus with an input coupled to an output of the RF signal source and two outputs coupled to the first and second electrodes, wherein the conversion apparatus is configured to receive the unbalanced RF signal at the input, to convert the unbalanced RF signal into a balanced RF signal comprised of first and second balanced RF signals, and to produce the first and second balanced RF signals at the two outputs.

5. The thermal increase system of claim 1, wherein the RF signal source includes a balanced amplifier configured to produce two balanced RF signals at two outputs of the RF signal source, wherein the two outputs are coupled to the first and second electrodes.

6. A thermal increase system coupled to a cavity for containing a load, the thermal increase system comprising:
    a radio frequency, RF, signal source configured to supply an unbalanced RF signal;
    a transmission path electrically coupled between the RF signal source and first and second electrodes that are positioned across the cavity;
    an impedance matching network electrically coupled along the transmission path, wherein the impedance matching network includes
        first and second input nodes,
        first and second output nodes,
        a first variable capacitor coupled between the first input node and the first output node, and
        a second variable capacitor coupled between the second input node and the second output node;
    power detection circuitry configured to detect reflected signal power along the transmission path;
    a controller configured to modify, based on the reflected signal power, capacitance values of the first and second variable capacitors of the impedance matching network to reduce the reflected signal power; and
    a conversion apparatus with an input coupled to an output of the RF signal source and two outputs coupled to the first and second electrodes, wherein the conversion apparatus is configured to receive the unbalanced RF signal at the input, to convert the unbalanced RF signal into a balanced RF signal comprised of first and second balanced RF signals, and to produce the first and second balanced RF signals at the two outputs.

7. A thermal increase system coupled to a cavity for containing a load, the thermal increase system comprising:
    a radio frequency, RF, signal source configured to supply an RF signal;

a transmission path electrically coupled between the RF signal source and first and second electrodes that are positioned across the cavity;
an impedance matching network electrically coupled along the transmission path, wherein the impedance matching network includes
first and second input nodes,
first and second output nodes,
a first variable capacitor coupled between the first input node and the first output node, and
a second variable capacitor coupled between the second input node and the second output node;
power detection circuitry configured to detect reflected signal power along the transmission path; and
a controller configured to modify, based on the reflected signal power, capacitance values of the first and second variable capacitors of the impedance matching network to reduce the reflected signal power, wherein the RF signal source includes a balanced amplifier configured to produce two balanced RF signals at two outputs of the RF signal source, wherein the two outputs are coupled to the first and second electrodes.

* * * * *